(12) United States Patent
Kim et al.

(10) Patent No.: US 11,345,851 B2
(45) Date of Patent: *May 31, 2022

(54) COMPOSITION, PATTERNED FILM, AND ELECTRONIC DEVICE INCLUDING THE SAME

(71) Applicant: SAMSUNG ELECTRONICS CO., LTD., Suwon-si (KR)

(72) Inventors: Taekhoon Kim, Hwaseong-si (KR); Seonmyeong Choi, Suwon-si (KR); Jongmin Lee, Hwaseong-si (KR); Tae Gon Kim, Hwaseong-si (KR); Young Seok Park, Yongin-si (KR); Shin Ae Jun, Seongnam-si (KR)

(73) Assignees: SAMSUNG ELECTRONICS CO., LTD., Gyeonggi-Do (KR); SAMSUNG DISPLAY CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/106,317

(22) Filed: Nov. 30, 2020

(65) Prior Publication Data

US 2021/0102120 A1 Apr. 8, 2021

Related U.S. Application Data

(63) Continuation of application No. 16/507,461, filed on Jul. 10, 2019, now Pat. No. 10,851,297.

(30) Foreign Application Priority Data

Jul. 10, 2018 (KR) .................. 10-2018-0080221

(51) Int. Cl.
*C09K 11/88* (2006.01)
*G03F 7/004* (2006.01)
(Continued)

(52) U.S. Cl.
CPC ........ *C09K 11/883* (2013.01); *C09K 11/0883* (2013.01); *G02F 1/133617* (2013.01);
(Continued)

(58) Field of Classification Search
CPC . C09K 11/883; C09K 11/0883; G03F 7/0043; G03F 7/032; G03F 7/029;
(Continued)

(56) References Cited

U.S. PATENT DOCUMENTS 7,867,557 B2 ‡ 1/2011 Pickett ................. C09K 11/883
427/21
8,309,170 B2 ‡ 11/2012 Jang ........................ C30B 29/40
427/21

(Continued)

FOREIGN PATENT DOCUMENTS

KR 0841186 B1 ‡ 6/2008
KR 0841186 B1 6/2008
(Continued)

OTHER PUBLICATIONS

Kyungnam Kim et al., "Highly luminescing multi-shell semiconductor nanocrystals InP/ZnSe/ZnS," Applied Physics Letters, Aug. 14, 2012, pp. 073107-1-073107-4, vol. 101, Issue 7, http://dx.doi.org/10.10631.4745844.‡

(Continued)

*Primary Examiner* — Joseph L Williams
*Assistant Examiner* — Jose M Diaz
(74) *Attorney, Agent, or Firm* — Cantor Colburn LLP

(57) ABSTRACT

A photosensitive composition including a quantum dot; a binder polymer including a carboxylic acid group; a photopolymerizable monomer including a carbon-carbon double bond; and a photoinitiator, a patterned film produced therefrom and a display device including the same. The quantum dot includes a seed including a first semiconductor nanoc-
(Continued)

rystal, a quantum well including a second semiconductor nanocrystal, the quantum well surrounding the seed and a shell disposed on the quantum well, the shell including a third semiconductor nanocrystal and not including cadmium, the second semiconductor nanocrystal has a different composition from each of the first semiconductor nanocrystal and the third semiconductor nanocrystal, and an energy bandgap of the second semiconductor nanocrystal is smaller than an energy bandgap of the first semiconductor nanocrystal and an energy bandgap of the third semiconductor nanocrystal.

29 Claims, 11 Drawing Sheets

(51) Int. Cl.
| | | |
|---|---|---|
| G03F 7/032 | (2006.01) | |
| G03F 7/029 | (2006.01) | |
| H01L 27/32 | (2006.01) | |
| G02F 1/13357 | (2006.01) | |
| C09K 11/08 | (2006.01) | |
| G03F 7/40 | (2006.01) | |
| B82Y 20/00 | (2011.01) | |
| B82Y 40/00 | (2011.01) | |
| G03F 7/16 | (2006.01) | |
| G03F 7/20 | (2006.01) | |
| G03F 7/32 | (2006.01) | |
| G03F 7/38 | (2006.01) | |

(52) U.S. Cl.
CPC ............ *G03F 7/0043* (2013.01); *G03F 7/029* (2013.01); *G03F 7/032* (2013.01); *H01L 27/322* (2013.01); *B82Y 20/00* (2013.01); *B82Y 40/00* (2013.01); *G03F 7/16* (2013.01); *G03F 7/168* (2013.01); *G03F 7/2004* (2013.01); *G03F 7/322* (2013.01); *G03F 7/38* (2013.01); *G03F 7/40* (2013.01)

(58) Field of Classification Search
CPC . G03F 7/04; G03F 7/16; G03F 7/2004; G03F 7/322; G03F 7/168; G03F 7/38; G03F 7/0007; G03F 7/105; G03F 7/0275; G03F 7/033; G03F 7/0047; H01L 27/322; H01L 2251/5369; G02F 1/133617; B82Y 20/00; B82Y 40/00; B82Y 30/00
See application file for complete search history.

(56) References Cited

U.S. PATENT DOCUMENTS

| | | | | |
|---|---|---|---|---|
| 8,963,119 B2 ‡ | 2/2015 | Jang | ................... | H01L 21/02409 |
| | | | | 257/13 |
| 9,793,446 B2 ‡ | 10/2017 | Kurtin | ................... | C09K 11/565 |
| 9,926,643 B2 ‡ | 3/2018 | Jang | ........................ | C30B 29/605 |
| 10,074,780 B2 ‡ | 9/2018 | Kurtin | ................... | C01B 19/007 |
| 10,851,297 B2 * | 12/2020 | Kim | ........................ | G03F 7/0007 |
| 2011/0108799 A1 ‡ | 5/2011 | Pickett | ................... | B82Y 30/00 |
| | | | | 257/14 |
| 2017/0179338 A1 ‡ | 6/2017 | Park | ........................ | H01L 33/30 |
| 2018/0216250 A1 ‡ | 8/2018 | Jang | ........................... | C30B 7/14 |
| 2018/0342652 A1 ‡ | 11/2018 | Kurtin | ................... | C09K 11/565 |

FOREIGN PATENT DOCUMENTS

| | | | | |
|---|---|---|---|---|
| KR | 20110140049 A | ‡ | 12/2011 | ............ H05B 33/14 |
| KR | 20110140049 A | | 12/2011 | |
| KR | 20140102210 A | ‡ | 8/2014 | ........... H01L 33/502 |
| KR | 20140102210 A | | 8/2014 | |
| KR | 1508568 B1 | ‡ | 4/2015 | |
| KR | 1508568 B1 | | 4/2015 | |
| KR | 20160120359 A | ‡ | 10/2016 | |
| KR | 20160120359 A | | 10/2016 | |
| KR | 20160142187 A | ‡ | 12/2016 | |
| KR | 20160142187 A | | 12/2016 | |

OTHER PUBLICATIONS

Yongsoo Yang et al., "Deciphering chemical order/disorder and material properties at the single-atom level," Nature, Feb. 2, 2017, pp. 75-79, vol. 542.‡

Nathalie Claes et al., "Characterization of Janus gold nanoparticles obtained via spontaneous binary polymer shell segregation," European Microscopy Congress 2016, Dec. 20, 2016, pp. 690-691, https://doi.org/10.1002/9783527808465.EMC2016.5982.‡

Dorian Dupont et al., "Indium Phosphide-Based Quantum Dots with Shell-Enhanced Absorption for Luminescent Down-Conversion," Advanced Materials, Jun. 5, 2017, pp. 1-6 (1700686), vol. 29, Issue 29.‡

David A. Browne et al., "Electron transport in unipolar InGaN/GaN multiple quantum well structures grown by NH3 molecular beam epitaxy," Journal of Applied Physics, May 8, 2015, pp. 185703-1-185703-9, vol. 117.‡

\* cited by examiner
‡ imported from a related application

FIG. 9
Pattern Preparation by using a photoresist
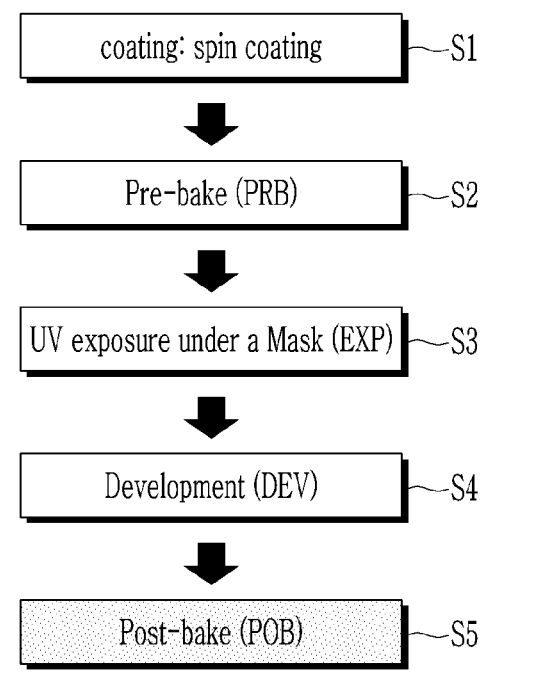
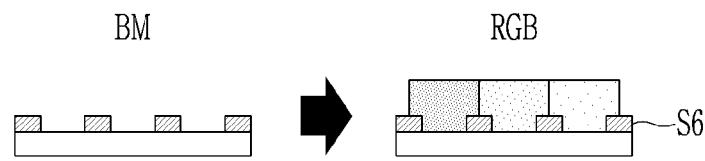
Repeating the Patterning Process three times

US 11,345,851 B2

COMPOSITION, PATTERNED FILM, AND ELECTRONIC DEVICE INCLUDING THE SAME

CROSS-REFERENCE TO RELATED APPLICATIONS

This application is a continuation application of application Ser. No. 16/507,461, filed Jul. 10, 2019, which claims priority to and the benefit of Korean Patent Application No. 10-2018-0080221 filed in the Korean Intellectual Property Office on Jul. 10, 2018, and all the benefits accruing therefrom under 35 U.S.C. § 119, the entire contents of which are incorporated herein by reference.

BACKGROUND

1. Field

A composition, a patterned film, and an electronic device including the same are disclosed.

2. Description of the Related Art

Quantum dots (i.e., nano-sized semiconductor nanocrystals) may have different energy bandgaps by controlling sizes and compositions of nanocrystals, and thus may emit light of various photoluminescence wavelengths. Quantum dots may exhibit electroluminescence and photoluminescence properties. Photoluminescence properties of quantum dots may be applied in various fields. In terms of environmental concerns, development of cadmium free quantum dots capable of realizing improved photoluminescence properties is desirable.

SUMMARY

An embodiment provides a composition including a non-cadmium quantum dot having improved photoluminescence properties (blue light absorption, etc.).

An embodiment provides a quantum dot-polymer composite including the non-cadmium quantum dot.

An embodiment provides a stack structure and an electronic device including the quantum dot-polymer composite.

An embodiment provides the non-cadmium quantum dot.

In an embodiment, a composition includes (e.g., a plurality of) quantum dot(s);

a dispersing agent (e.g., a binder polymer including a carboxylic acid group);

a polymerizable (e.g., photopolymerizable) monomer including a carbon-carbon double bond;

an initiator; and a solvent, wherein the quantum dot includes a seed including a first semiconductor nanocrystal, a quantum well including a second semiconductor nanocrystal, the quantum well surrounding the seed, and a shell disposed on the quantum well, the shell including a third semiconductor nanocrystal, and the quantum dot not including cadmium, the second semiconductor nanocrystal has a different composition from each of the first semiconductor nanocrystal and the third semiconductor nanocrystal, an energy bandgap of the second semiconductor nanocrystal is smaller than an energy bandgap of the first semiconductor nanocrystal and an energy bandgap of the third semiconductor nanocrystal, and a valence band edge and a conduction band edge of the second semiconductor nanocrystal are present within a bandgap of the first semiconductor nanocrystal.

The quantum dot may emit red light and a thickness of the quantum well may be greater than or equal to about 0.9 nanometers (nm), for example, greater than or equal to about 1 nm and less than or equal to about 1.9 nm, for example, less than or equal to about 1.8 nm.

The quantum dot may emit green light and a thickness of the quantum well may be greater than or equal to about 0.3 nm or greater than or equal to about 0.4 nm and less than or equal to about 1.4 nm (e.g., less than or equal to about 1.32 nm, less than or equal to about 1 nm, less than or equal to about 0.9 nm, less than or equal to about 0.8 nm, less than or equal to about 0.7 nm, or less than or equal to about 0.6 nm).

The seed may have a radius (or an average radius) of greater than or equal to about 0.5 nm.

The shell may have a thickness of greater than or equal to about 0.5 nm, greater than or equal to about 8 nm, greater than or equal to about 1 nm, greater than or equal to about 1.32 nm, greater than or equal to about 1.5 nm and less than or equal to about 4 nm, less than or equal to about 3 nm, less than or equal to about 2 nm, less than or equal to about 1.5 nm, less than or equal to about 1.4 nm, or less than or equal to about 1 nm.

The first semiconductor nanocrystal may include zinc and selenium, sulfur, or a combination thereof.

The third semiconductor nanocrystal may include zinc and selenium, sulfur, or a combination thereof.

The first semiconductor nanocrystal may include ZnSe, ZnSeS, ZnS, or a combination thereof.

The third semiconductor nanocrystal may include ZnSe, ZnSeS, ZnS, or a combination thereof.

The shell may include two or more layers and at least two adjacent layers may include semiconductor nanocrystals comprising different compositions.

The second semiconductor nanocrystal may include a Group II-VI compound, a Group III-V compound, or a combination thereof.

The second semiconductor nanocrystal may include ZnSe, ZnTeSe, InP, InZnP, InAs, GaAs, or a combination thereof.

The radius of the seed may be greater than or equal to about 60%, for example, greater than or equal to about 65%, greater than or equal to about 70%, greater than or equal to about 75%, greater than or equal to about 80%, greater than or equal to about 85%, greater than or equal to about 90%, or greater than or equal to about 95% of the thickness of the shell.

The radius of the seed may be greater than or equal to the thickness of the shell (e.g., greater than or equal to about 110%, greater than or equal to about 120%, greater than or equal to about 130%, greater than or equal to about 140%, greater than or equal to about 150%, greater than or equal to about 160%, greater than or equal to about 170%, greater than or equal to about 180%, greater than or equal to about 190%, greater than or equal to about 200%, or greater than or equal to about 210% of the thickness of the shell).

The radius of the seed may be less than or equal to about 400%, less than or equal to about 350%, less than or equal to about 300%, less than or equal to about 250%, less than or equal to about 240%, less than or equal to about 230%, less than or equal to about 220%, less than or equal to about 210%, less than or equal to about 200%, less than or equal to about 190%, less than or equal to about 180%, less than or equal to about 170%, less than or equal to about 160%, less than or equal to about 150%, less than or equal to about 140%, less than or equal to about 130%, less than or equal to about 120%, or less than or equal to about 110% of the thickness of the shell.

The thickness of the shell may be greater than or equal to about 1.3 nm.

The radius of the seed may be greater than or equal to about 1.5 nm.

The dispersing agent may be a binder polymer including a carboxylic acid group, and the binder polymer may include a copolymer of a monomer combination including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a multiple aromatic ring-containing polymer including a backbone structure wherein two aromatic rings are bound to a quaternary carbon atom that is a constituent atom of another cyclic moiety in the main chain, the multiple aromatic ring-containing polymer including a carboxylic acid group (—COOH); or a combination thereof.

The binder polymer including a carboxylic acid group may have an acid value of greater than or equal to about 50 milligrams of potassium hydroxide per gram (mg KOH/g) and less than or equal to about 240 mg KOH/g.

The composition may further include a multiple thiol compound including at least two thiol groups at a terminal end of the multiple thiol compound, a metal oxide particulate, or a combination thereof.

An embodiment provides a patterned film including a repeating section, the repeating section comprising a first section configured to emit a first light, wherein the first section includes a quantum dot polymer composite, the quantum dot-polymer composite includes a polymer matrix including a binder polymer including a carboxylic acid group, a polymerization product of a photopolymerizable monomer including a carbon-carbon double bond, and optionally a polymerization product of the photopolymerizable monomer and a multiple thiol compound including at least two thiol groups at a terminal end of the multiple thiol compound; and (e.g., a plurality of) first quantum dot(s) dispersed in the polymer matrix and configured to emit the first light, the first quantum dot includes a seed including a first semiconductor nanocrystal, a quantum well including a second semiconductor nanocrystal, the quantum well surrounding the seed and a shell disposed on the quantum well, the shell including a third semiconductor nanocrystal, the first quantum dot not including cadmium, the second semiconductor nanocrystal has a different composition from each of the first semiconductor nanocrystal and the third semiconductor nanocrystal, an energy bandgap of the second semiconductor nanocrystal is smaller than an energy bandgap of the first semiconductor nanocrystal and an energy bandgap of the third semiconductor nanocrystal.

A valence band edge and a conduction band edge of the second semiconductor nanocrystal may be within a bandgap of the first semiconductor nanocrystal.

The quantum dot, the quantum dot polymer composite or the patterned film of an embodiment does not include a toxic heavy metal such as cadmium, lead, mercury, or the like.

The quantum dot polymer composite may exhibit a blue absorption (rate) of greater than or equal to about 80%, greater than or equal to about 81%, greater than or equal to about 82%, greater than or equal to about 83%, greater than or equal to about 84%, greater than or equal to about 85%, greater than or equal to about 86%, greater than or equal to about 87%, greater than or equal to about 88%, greater than or equal to about 89%, or greater than or equal to about 90% (at a predetermined quantum dot amount in the composite, e.g., less than or equal to about 45 wt %, 44 wt %, 43 wt %, 42 wt %, 41 wt %, or less)

When a maximum peak wavelength of the first light is within the range of about 600 nm to about 650 nm, a thickness of the quantum well may be greater than or equal to about 0.9 nm (e.g., greater than or equal to about 1 nm) and less than or equal to about 1.9 nm (e.g., less than or equal to about 1.8 nm).

When the maximum peak wavelength of the first light is within the range of about 500 nm to about 580 nm, a thickness of the quantum well may be greater than or equal to about 0.4 nm and less than or equal to about 1.4 nm.

The seed may have a radius of greater than or equal to about 0.5 nm.

A thickness of the shell may be greater than or equal to about 0.5 nm and less than or equal to about 3 nm.

The first semiconductor nanocrystal may include zinc and selenium, sulfur, or a combination thereof. The third semiconductor nanocrystal may include zinc and sulfur. The second semiconductor nanocrystal may include ZnSe, ZnTeSe, InP, InAs, GaAs, or a combination thereof.

The radius of the seed may be greater than or equal to about 60%, greater than or equal to about for example, 70%, greater than or equal to about 80%, or greater than or equal to about 90% of the thickness of the shell.

The radius of the seed may be greater than or equal to the thickness of the shell.

The thickness of the shell may be greater than or equal to about 1.3 nm.

The radius of the seed may be greater than or equal to about 1.5 nm.

The repeating section may further include a second section to emit a second light having a different maximum peak wavelength form the first light. The second section may include a second quantum dot configured to emit the second light.

In an embodiment, a display device includes a light source and a photoluminescence element, wherein the photoluminescence element includes a substrate and the patterned film disposed on a surface of the substrate, and the light source is configured to supply the photoluminescence element with incident light.

The incident light may have a photoluminescence peak wavelength within a range of about 440 nm to about 460 nm.

In an embodiment, the quantum dot is provided.

An embodiment provides an electronic device including the quantum dot.

The electronic device may be an electroluminescent device, an organic light emitting diode (OLED), a sensor, an imaging sensor, a solar cell, or a liquid crystal display (LCD) device.

The quantum dot according to an embodiment may exhibit improved photoluminescence properties (e.g., improved blue light absorption). The quantum dot may be applied to various display devices and (e.g., bio sensor or bio imaging, etc.) biological labelling, a photo detector, a solar cell, a hybrid composite, and the like.

BRIEF DESCRIPTION OF THE DRAWINGS

FIG. 9 is a schematic cross-sectional view of a device according to an embodiment.

DETAILED DESCRIPTION

Figure 1:
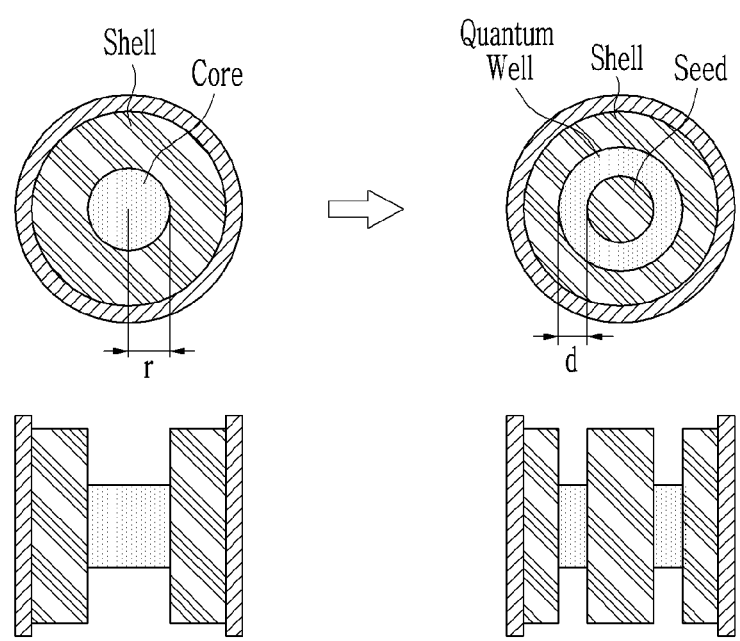
FIG. 1 is a schematic cross-sectional view of a quantum dot according to an embodiment and a schematic view of energy level arrangements.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

Further, the singular includes the plural unless mentioned otherwise.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer" or "section" discussed below could be termed a second element, component, region, layer, or section without departing from the teachings herein.

The terminology used herein is for the purpose of describing particular embodiments only and is not intended to be limiting. "Or" means "and/or." As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to replacement of hydrogen of a compound by a substituent selected from a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

As used herein, when a definition is not otherwise provided, "monovalent organic functional group" refers to a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group.

As used herein, when a definition is not otherwise provided, the term "hetero" refers to inclusion of at least one to three heteroatoms selected from, N, O, S, Si, and P.

As used herein, when a definition is not otherwise provided, "alkylene group" refers to a straight or branched saturated aliphatic hydrocarbon group having at least two valences and optionally substituted with at least one substituent. As used herein, "arylene group" may refer to a functional group having at least two valences obtained by removal of at least two hydrogens in at least one aromatic ring, and optionally substituted with at least one substituent.

As used herein, when a definition is not otherwise provided, "aliphatic organic group" refers to a C1 to C30 linear or branched alkyl group, "aromatic organic group" may refer to a C6 to C30 aryl group or a C2 to C30 heteroaryl group, and "alicyclic organic group" may refer to a C3 to C30 cycloalkyl group, a C3 to C30 cycloalkenyl group, and a C3 to C30 cycloalkynyl group.

As used herein, when a definition is not otherwise provided, "(meth)acrylate" refers to acrylate and/or methacrylate.

As used herein, when a definition is not otherwise provided, "alkoxy" means an alkyl group that is linked via an oxygen (i.e., alkyl-O—), for example methoxy, ethoxy, and sec-butyloxy groups.

As used herein, when a definition is not otherwise provided, "alkyl" means a straight or branched chain, saturated, monovalent hydrocarbon group (e.g., methyl or hexyl).

As used herein, when a definition is not otherwise provided, "alkynyl" means a straight or branched chain, monovalent hydrocarbon group having at least one carbon-carbon triple bond (e.g., ethynyl).

As used herein, when a definition is not otherwise provided, "amine group" has the general formula —NRR, wherein each R is independently hydrogen, a C1-C12 alkyl group, a C7-C20 alkylarylene group, a C7-C20 arylalkylene group, or a C6-C18 aryl group.

As used herein, when a definition is not otherwise provided, "arene" means a hydrocarbon having an aromatic ring, and includes monocyclic and polycyclic hydrocarbons wherein the additional ring(s) of the polycyclic hydrocarbon may be aromatic or nonaromatic. Specific arenes include benzene, naphthalene, toluene, and xylene.

As used herein, when a definition is not otherwise provided, "aromatic" means an organic compound or group comprising at least one unsaturated cyclic group having delocalized pi electrons. The term encompasses both hydrocarbon aromatic compounds and heteroaromatic compounds.

As used herein, when a definition is not otherwise provided, "aryl" means a monovalent group formed by the removal of one hydrogen atom from one or more rings of an arene (e.g., phenyl or naphthyl).

As used herein, when a definition is not otherwise provided, "arylalkyl" means a substituted or unsubstituted aryl group covalently linked to an alkyl group that is linked to a compound (e.g., a benzyl is a C7 arylalkyl group).

As used herein, when a definition is not otherwise provided, "cycloalkenyl" means a monovalent group having one or more rings and one or more carbon-carbon double bond in the ring, wherein all ring members are carbon (e.g., cyclopentyl and cyclohexyl).

As used herein, when a definition is not otherwise provided, "cycloalkyl" means a monovalent group having one or more saturated rings in which all ring members are carbon (e.g., cyclopentyl and cyclohexyl).

As used herein, when a definition is not otherwise provided, "cycloalkynyl" means a stable aliphatic monocyclic or polycyclic group having at least one carbon-carbon triple bond, wherein all ring members are carbon (e.g., cyclohexynyl).

As used herein, when a definition is not otherwise provided, "ester" refers to a group of the formula —O(C=O)Rx or a group of the formula —(C=O)ORx wherein Rx is C1 to C28 aromatic organic group or aliphatic organic group. An ester group includes a C2 to C30 ester group, and specifically a C2 to C18 ester group.

As used herein, when a definition is not otherwise provided, "heteroalkyl" is an alkyl group that comprises at least one heteroatom covalently bonded to one or more carbon atoms of the alkyl group. Each heteroatom is independently chosen from nitrogen (N), oxygen (O), sulfur (S), and or phosphorus (P).

As used herein, when a definition is not otherwise provided, "ketone" refers to a C2 to C30 ketone group, and specifically a C2 to C18 ketone group. Ketone groups have the indicated number of carbon atoms, with the carbon of the keto group being included in the numbered carbon atoms. For example a C2 ketone group is an acetyl group having the formula CH3(C=O)—.

In an embodiment, "hydrophobic moiety" may be a moiety providing the corresponding compound with a tendency to be agglomerated in an aqueous solution and to repel water. For example, the hydrophobic moiety may include an aliphatic hydrocarbon group having a carbon number of 2 or greater (alkyl, alkenyl, alkynyl, etc.), an aromatic hydrocarbon group having a carbon number of 6 or greater (phenyl, naphthyl, aralkyl group, etc.), or an alicyclic hydrocarbon group having a carbon number of 5 or greater (cyclohexyl, norbornene, norbornane, tricyclodecane, etc.). In an embodiment, the hydrophobic moiety may not be mixed with the ambient medium, the hydrophobic moiety may be substantially lacking capability of forming a hydrogen bond with the ambient medium, and/or the polarity of the hydrophobic moiety may not be matched with the ambient medium.

As used herein, when a definition is not otherwise provided, "visible light" refers to light having a wavelength of about 390 nm to about 700 nm. As used herein, when a definition is not otherwise provided, "UV" or "ultraviolet" refers to light having a wavelength of greater than or equal to about 200 nm and less than about 390 nm.

As used herein, when a definition is not otherwise provided, "dispersion" refers to dispersion wherein a dispersed phase is a solid and a continuous phase includes a liquid. For example, "dispersion" may refer to a colloidal dispersion wherein the dispersed phase has a dimension of greater than or equal to about 1 nm, for example, greater than or equal to about 2 nm, greater than or equal to about 3 nm, or greater than or equal to about 4 nm and several micrometers (μm) or less, (e.g., about 2 μm or less or about 1 μm or less).

As used herein, "Group" may refer to a group of Periodic Table.

As used herein, "Group I" may refer to Group IA and Group IB, and examples may include Li, Na, K, Rb, and Cs, but are not limited thereto.

As used herein, "Group II" may refer to Group IIA and Group IIB, and examples of Group II metal may be Cd, Zn, Hg, and Mg, but are not limited thereto.

As used herein, "Group III" may refer to Group IIIA and Group IIIB, and examples of Group III metal may be Al, In, Ga, and TI, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

As used herein, a recited value for a dimension (e.g., a diameter, a radius, a thickness, a size, or the like) may be a value for a single entity (e.g., a particle or a quantum dot) or an average value for a plurality of the entities (e.g., a population of particles or quantum dots), which may be obtained from a proper analytic tool (e.g., a transmission electron microscopy (TEM) analysis, a spectroscopic analysis, or the like).

A semiconductor nanocrystal particle also known as a quantum dot is a crystalline material having a size of several nanometers. The semiconductor nanocrystals particle may have a large surface area per unit volume due to, for example, relatively small sizes and may exhibit different characteristics from bulk materials having the same composition due to, for example, a quantum confinement effect. A quantum dot may absorb light from an excitation source to be excited, and may emit energy corresponding to an energy bandgap of the quantum dot. A quantum dot may have a theoretical quantum yield (QY) of 100% and may emit light having high color purity (e.g., a full width at half maximum (FWHM) of less than or equal to about 40 nm), and thus may realize increased quantum efficiency and improved color reproducibility.

Quantum dots have potential applicability to, e.g., in, various electronic devices due to unique photoluminescence characteristics. Cadmium-based quantum dots may have properties applicable to, e.g., in, an electronic device and the like. However, cadmium may cause serious environment/health problems and is a restricted element. A cadmium-free quantum dot (hereinafter, also referred to as a non-cadmium quantum dot) may be a Group III-V based nanocrystal. A non-cadmium quantum dot may have inferior photoluminescence properties (e.g., blue light absorption) and stability relative to a cadmium-based quantum dot.

A photoluminescent type color filter is an alternative to overcome technical limits of a display device including an absorption type color filter. Since polarized light that has passed through a liquid crystal may express, e.g., emit, a color while passing, e.g., passing through, an absorption type color filter, a liquid crystal display (LCD) may exhibit problems such as deteriorated luminance due to, for example, a narrow viewing angle and a low light transmittance of the absorption type color filter. On the other hand, a quantum dot-based color filter may use blue light instead of white light as an excitation light, and a color filter may be disposed in front of the device to convert the excitation light to the desirable light (e.g., green light/red light). Thereby, a quantum dot-based color filter may solve the fundamental technical problems of, for example, a liquid crystal display (e.g., narrow viewing angle and considerable light loss). For example, the viewing angle problem may be solved since light having linearity may be scattered in all directions while passing, e.g., passing through, a liquid crystal layer, thereby light loss that may occur in the absorption type color filter may be prevented. But when employing a quantum dot-based color filter, excitation light propagating toward the front side of the device may cause a serious defect, and thus it may be desirable for the excitation light propagating toward the front side of the device to be blocked, whereby the cost of a device including a quantum dot-based color filter may increase.

In this regard, it may be desirable for a quantum dot-based color filter to have increased absorption with respect to excitation light. A quantum dot (particularly, a non-cadmium quantum dot) may not provide desirable absorption. Introducing a light scattering body may improve the absorption, but introducing a light scattering body may cause problems of increasing cost and external light reflection, and the solid portion increase may cause additional difficulties in the process. In order to block the excitation light, a blue light filter may be used, which may cause an increase in cost and external light reflection, and may cause optical loss, contrast deterioration, and reduction in sharpness of an image displayed by the display device.

For application in a color filter, a quantum dot may be provided as a pattern of, e.g., including, a composite wherein the quantum dots are dispersed in a host matrix (e.g., including a polymer, an inorganic material, or a combination thereof). The weight of quantum dots included in the composite may be limited for various reasons in a process. Accordingly, it may be desirable to develop a quantum dot exhibiting an improved blue absorption at a predetermined weight for applying to a color filter.

A composition of an embodiment is based on a cadmium-free quantum dot (hereinafter, also referred to as a quantum dot) and a quantum dot-polymer composite pattern prepared therefrom may exhibit improved blue light absorption.

The composition according to an embodiment includes (e.g., a plurality of) quantum dot(s); a binder polymer including a carboxylic acid group; a photopolymerizable monomer including a carbon-carbon double bond; and a photoinitiator. The quantum dot is a cadmium-free non-cadmium quantum dot. The quantum dot includes a seed including a first semiconductor nanocrystal, a quantum well including a second semiconductor nanocrystal and surrounding the seed, and a shell disposed on the quantum well and including a third semiconductor nanocrystal. The second semiconductor nanocrystal has a different composition from each of the first semiconductor nanocrystal and the third semiconductor nanocrystal.

An energy bandgap of the second semiconductor nanocrystal is smaller than an energy bandgap of the third semiconductor nanocrystal. A valence band edge and a conduction band edge of the second semiconductor nanocrystal are within a bandgap of the first semiconductor nanocrystal That is to say, the energy bandgap of the second semiconductor nanocrystal is smaller than the energy bandgap of the first semiconductor nanocrystal.

An energy excitation source of the quantum dot may be a blue light (e.g., having a wavelength of about 450 nm). A cadmium-based quantum dot may have a high absorption intensity for such blue light. But a non-cadmium quantum dot may have unsatisfactory absorption intensity for blue light (e.g., at a wavelength of 450 nm), which may cause a reduction in luminance. Quantum dots according to an embodiment may exhibit remarkably improved absorption for, e.g., of, blue light even without cadmium, and the composition including the quantum dot may provide a quantum dot-polymer composite pattern that exhibits improved absorption for, e.g., of, blue light. In an embodiment, the quantum dot may have a ratio of an intensity at 450 nm relative to the intensity of the first absorption peak wavelength of greater than or equal to about 1:1 in a UV-Vis absorption spectrum.

The quantum dot may emit red light or green light. The red light may have a maximum photoluminescence peak wavelength of greater than or equal to about 600 nm, for example, greater than or equal to about 610 nm, or greater than or equal to about 620 nm, and less than or equal to about 650 nm, for example, less than or equal to about 640 nm, or less than or equal to about 635 nm. The green light may have a maximum photoluminescence peak wavelength of greater than or equal to about 500 nm, for example, greater than or equal to about 510 nm, greater than or equal to about 520 nm, greater than or equal to about 530 nm, or greater than or equal to about 540 nm and less than or equal to about 580 nm, for example, less than or equal to about 570 nm, less than or equal to about 560 nm, or less than or equal to about 550 nm.

When the quantum dot emits red light, for example, the thickness of the quantum well may be greater than or equal to about 0.9 nm, for example, greater than or equal to about 1.0 nm, greater than or equal to about 1.05 nm, and less than or equal to about 1.9 nm, for example, less than or equal to about 1.85 nm, less than or equal to about 1.8 nm, less than or equal to about 1.5 nm, less than or equal to about 1.4 nm, less than or equal to about 1.3 nm, or less than or equal to about 1.2 nm.

When the quantum dot emits green light, for example, the thickness of the quantum well may be greater than or equal to about 0.3 nm, for example, greater than or equal to about 0.4 nm, greater than or equal to about 0.5 nm, greater than or equal to about 0.6 nm, or greater than or equal to about 0.65 nm and less than or equal to about 1.4 nm, for example, less than or equal to about 1.35 nm, less than or equal to about 1.33 nm, less than or equal to about 1.32 nm, less than or equal to about 1.31 nm, or less than or equal to about 1.3 nm.

In the quantum dot according to an embodiment, the radius of the seed and the thickness of the quantum well may be controlled based on a desirable photoluminescence wavelength.

The radius of the seed may be greater than or equal to about 0.5 nm, for example, greater than or equal to about 0.6 nm, greater than or equal to about 0.7 nm, greater than or equal to about 0.8 nm, greater than or equal to about 0.9 nm, greater than or equal to about 1 nm, greater than or equal to about 1.1 nm, greater than or equal to about 1.2 nm, greater than or equal to about 1.3 nm, greater than or equal to about 1.4 nm, greater than or equal to about 1.5 nm, greater than or equal to about 1.6 nm, greater than or equal to about 1.7 nm, greater than or equal to about 1.8 nm, or greater than or equal to about 1.9 nm.

In the quantum dot according to an embodiment, the radius of the seed may be less than or equal to about 4 nm, less than or equal to about 3.5 nm, less than or equal to about 3.4 nm, less than or equal to about 3.3 nm, less than or equal to about 3.2 nm, less than or equal to about 3.1 nm, less than or equal to about 3 nm, less than or equal to about 2.9 nm, less than or equal to about 2.8 nm, less than or equal to about 2.7 nm, less than or equal to about 2.6 nm, less than or equal to about 2.5 nm, less than or equal to about 2.4 nm, less than or equal to about 2.3 nm, less than or equal to about 2.2 nm, less than or equal to about 2.1 nm, less than or equal to about 2 nm, less than or equal to about 1.9 nm, less than or equal to about 1.8 nm, less than or equal to about 1.7 nm, less than or equal to about 1.6 nm, less than or equal to about 1.5 nm, less than or equal to about 1.4 nm, or less than or equal to about 1.3 nm.

The first semiconductor nanocrystal may include zinc and selenium, sulfur, or a combination thereof. In an embodiment, the first semiconductor nanocrystal may include ZnSe, ZnSeS, ZnS, or a combination thereof.

The third semiconductor nanocrystal may include zinc and selenium, sulfur, or a combination thereof. The third semiconductor nanocrystal may include ZnSe, ZnSeS, ZnS, or a combination thereof. The third semiconductor nanocrystal may have a different composition from the first semiconductor nanocrystal. The third semiconductor nanocrystal may have the same composition as the first semiconductor nanocrystal. The energy bandgap of the third semiconductor nanocrystal may be greater than the energy bandgap of the first semiconductor nanocrystal.

The quantum dot having the aforementioned structure may have a luminescence center that is present in the quantum well. In other words, a charge carrier may be at least partially (or completely or entirely) confined or delocalized in the shell.

The shell may include two or more layers and adjacent layers may include semiconductor nanocrystals having different compositions from one another. A first layer of the shell may include ZnSe, ZnSeS, or a combination thereof. A second layer of the shell may include ZnS. The semiconductor nanocrystal of the second layer of the shell may have a greater energy bandgap than that of the first layer of the shell. The second layer of the shell may be an outermost layer of the quantum dot. The shell may have a composition that varies in a radial direction. For example, the shell may have a concentration gradient wherein the concentration of sulfur is increased in a radial direction.

The second semiconductor nanocrystal included in the quantum well may include a Group II-VI compound (e.g., including zinc, and selenium, tellurium, or a combination thereof), a Group III-V compound (e.g., including indium or gallium, optionally further including zinc, and including phosphorus, arsenic, or a combination thereof), or a combination thereof.

The second semiconductor nanocrystal may include ZnSe, ZnTeSe, InP, InZnP, InAs, GaAs, or a combination thereof. The second semiconductor nanocrystal may not include copper.

In the quantum dot according to an embodiment, the first semiconductor nanocrystal may include ZnSe, the second semiconductor nanocrystal may include InP, and the third semiconductor nanocrystal may include ZnSe, ZnS, or a combination thereof.

In the composition according to an embodiment, the quantum dot has the above composition/structure, and accordingly the composition according to an embodiment may exhibit an increased blue absorption.

The present inventors have found that the quantum well of the quantum dot according to an embodiment may function as a luminescence center, and the photoluminescence wavelength may be changed depending upon a thickness of the quantum well, and the blue absorption may be affected by a volume of the luminescence center, that is, the quantum well. Hereinafter, a quantum dot having a structure including a ZnSe core, an InP quantum well, and a shell including ZnSe will be described, but embodiments are not limited thereto.

A core/shell quantum dot including an indium phosphide core and a shell including ZnSe and ZnS may have a schematic cross-section and an energy band alignment shown in the left side of FIG. 1. The quantum dot according to an embodiment may have a schematic cross-section and an energy band alignment shown in the right side of FIG. 1.

The present inventors have found that the luminescence centers of both of the quantum dot having the core-shell structure and the quantum dot according to an embodiment may be provided by the indium phosphide, and a core radius or a thickness of the quantum well may substantially influence on a photoluminescence wavelength. The present inventors have also found that, when the volume of the luminescence center in the quantum dot is increased, the number of the energy levels capable of absorbing blue light may also increase, and thereby the blue absorption may be increased, as well. Compared to a core having a radius, r, the quantum well having a thickness, d, generating light at the same wavelength may exhibit a higher blue absorption, which is confirmed by a simulation modeling of the quantum dot absorption spectrum based on the effective mass approximation.

In addition, according to the research of the present inventors, the thickness of the quantum well that may be desirable for emitting light of a predetermined wavelength may decrease due to, for example, an increase of a seed radius and may converge on a predetermined value.

The present inventors have also found experimentally that the thickness of the shell may have a substantial influence on a photoluminescence wavelength of quantum dot but, at the same time, when the shell thickness (e.g., d_ZnSe+d_ZnS in FIG. 2) reaches a predetermined level, the shell thickness may not have a substantial influence on the photoluminescence wavelength of the quantum dot, and the predetermined level may be changed depending upon the composition of quantum dot.

Figure 2:
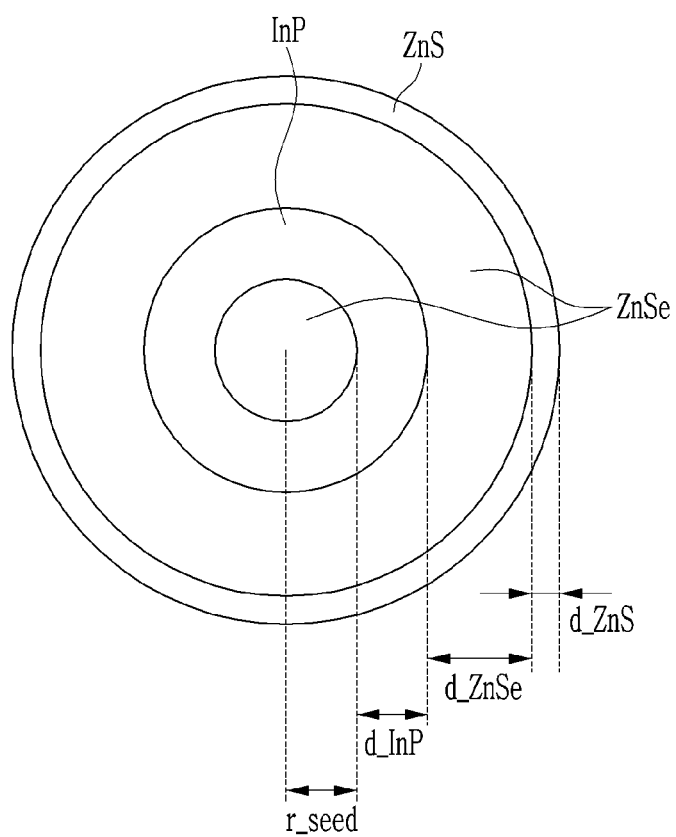
FIG. 2 is a schematic cross-sectional view of a quantum dot according to an embodiment.

For example, referring to FIG. 2, when a thickness (d) of the indium phosphide quantum well for emitting green light is equal to zero, the seed radius (r) may correspond to a core radius (r) of the core/shell quantum dot for emitting green light. The relationship between the seed radius (r) and the quantum well thickness (d) may be calculated using the following one band Schrodinger Equation in the effective mass approximation:

$$-\frac{h^2}{8\pi^2}\left(\nabla \cdot \left(\frac{1}{m_e(r)}\nabla \Psi(r)\right)\right) + V(r)\Psi(r) = E\Psi(r)$$

wherein, in the equation, h: Planck constant, $\psi(r)$: wave function,

E: eigenvalue (energy), $m_e(r)$: effective mass function,

V(r): potential distribution (conduction/valence band edge) function, and r: electron position.

For the quantum dot having the composition as illustrated in FIG. 2, the information as to a band alignment between materials composing the quantum dot (e.g., indium phosphide, zinc selenide, zinc sulfide, etc.), an energy bandgap of each material, and an effective mass of electrons and holes, a size of the seed, and a thickness of the quantum well is applied to the foregoing equation. Using all combinations of the seed size and the quantum well thickness, a highest occupied molecular orbital (HOMO) value and a lowest unoccupied molecular orbital (LUMO) value of the quantum well are calculated, and thereby, a photoluminescence wavelength is calculated. The combinations of the seed size and the quantum well for emitting green light at a wavelength of about 540 nm and red light at a wavelength of about 620 nm among the calculated light emitting wavelengths are monitored and plotted in a graph as shown in FIG. 3.

Figure 3:
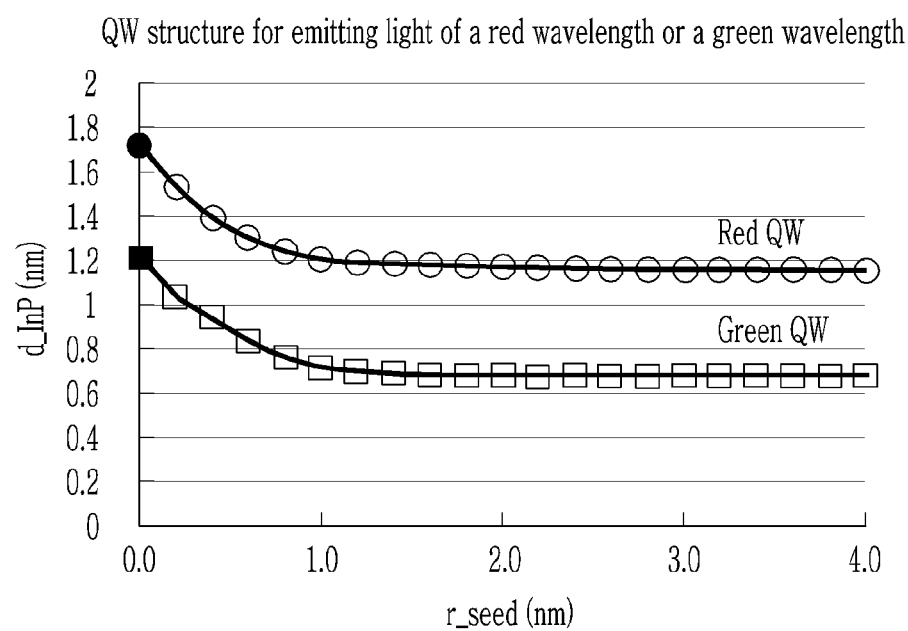
FIG. 3 is a graph of thickness of InP quantum wells (QW) for red light emission and green light emission (d_InP (nm)) versus seed radius in a quantum dot (InP quantum well) (r_seed (nm)) (including a Group III-V semiconductor nanocrystal, for example, an InP quantum well) according to an embodiment.

Referring to FIG. 3, it has been found that the thickness of the quantum well converges on a predetermined value as the seed radius (r) increase. According to the results, in order for the quantum dot having the seed radius of about 1 nm to emit light of the same wavelength as the indium phosphide core having a radius of about 1.2 nm, a thickness of an indium phosphide-containing quantum well may be about 0.7 nm, and in such a quantum dot, the actual volume of the quantum well is about 2.18 times greater than that of the indium phosphide core volume of the core/shell quantum dot (i.e., having the seed radius of about 0) and it is believed that such a volume increase may also provide an improvement of the blue light absorption.

For the quantum dot having the structure illustrated in FIG. 2, when the shell thickness is fixed at a predetermined value (e.g., the value confirmed to have no substantial influence on a photoluminescence wavelength), the volume of the quantum well (e.g., indium phosphide quantum well) per unit mass of the quantum dot may be calculated by the following equation.

$$\frac{V_{InP}}{m_{QD}} = \frac{V_{InP}}{\rho_{InP}V_{InP} + \rho_{ZnSe}(V_{seed} + V_{ZnSe,shell}) + \rho_{ZnS}V_{ZnS,shell}}$$

wherein, in the equation, $m_{QD}$ is a total mass of a quantum dot, $V_{InP}$ is a volume of a quantum well, $\rho_{InP}$ is a mass density of a quantum well, $V_{seed}$ is a volume of a seed, $V_{Znse, shell}$ is a volume of a ZnSe shell, $\rho_{ZnSe}$ is a mass density of ZnSe, $V_{ZnS, shell}$ is a volume of a ZnS shell, and $\rho_{ZnS}$ is a mass density of ZnS.

Figure 4:
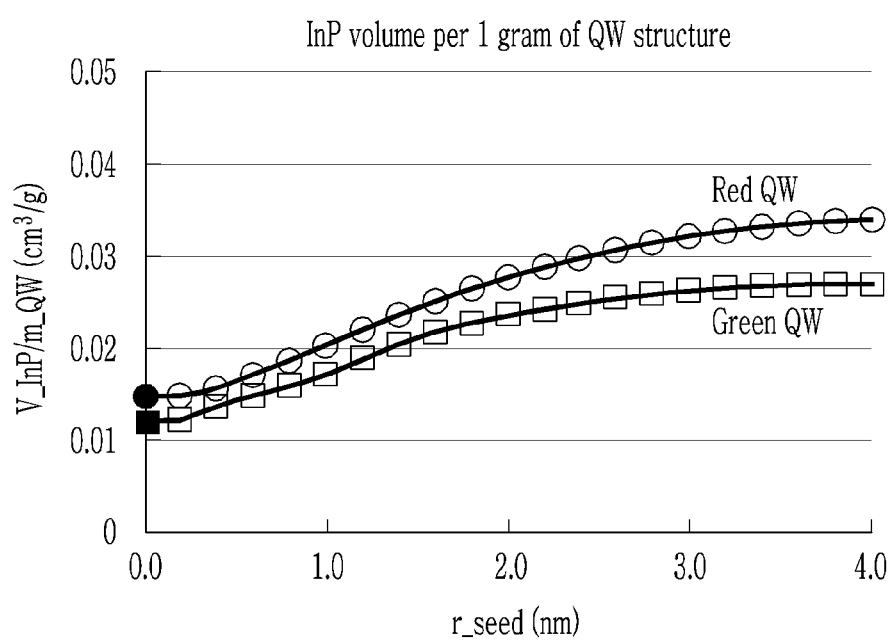
FIG. 4 is a graph of volume (V) per quantum dot unit mass (m) of InP quantum wells (V_InP/m_QW (cubic centimeter per gram ($cm^3/g$))) versus seed radius in a quantum dot (InP quantum well) (r_seed (nm)) (including a Group III-V semiconductor nanocrystal, for example, an InP quantum well) according to an embodiment.

In the foregoing equation, a and b are fixed to the predetermined values (e.g., 1.32 nm and 0.63 nm), respectively, and the volume of the quantum well (e.g., indium phosphide quantum well) per the total mass of the quantum dot may be plotted with the change of the seed radius as shown in FIG. 4.

As shown in FIG. 4, it is believed that the volume of the quantum well (e.g., indium phosphide quantum well) relative to the total mass of the quantum dot may be increased with the increase of the seed radius, and from the graph, it is confirmed that there is a value of a seed size ($r_{opt}$) that may theoretically maximize the volume of the quantum well per weight of the quantum dot.

$$\left.\frac{\partial}{\partial r}\left(\frac{V_{InP}}{m_{QD}}\right)\right|_{r=r_{opt}} = 0$$

When simplified by excluding the presence of the ZnS layer from the quantum dot shown in FIG. 2, the volume of the quantum well (e.g., indium phosphide quantum well) per unit mass of quantum dot may be expressed as the following equation.

$$\frac{V_{InP}}{m_{QD}} = \frac{V_{InP}}{\rho_{InP}V_{InP} + \rho_{ZnSe}(V_{seed} + V_{shell})}$$

$$= \frac{1}{\rho_{InP} + \rho_{ZnSe}\left(\frac{V_{QD}}{V_{InP}} - 1\right)}$$

wherein, in the equation, $V_{QD}$=a total volume of a quantum dot.

From the equation, the volume of the quantum dot per unit volume of the quantum well ($V_{QD}/V_{InP}$) may be minimized in order to maximize the volume of the quantum well per mass of quantum dot, and the calculation of the seed radius from the foregoing equation may indicate that a seed radius for maximizing the volume of the quantum well per unit mass of the quantum dot may be related to a thickness of the shell (e.g., at least about 0.9 times, at least about 1 time, at least about 1.1 times, or at least about 1.2 times of the seed radius):

$$\left.\frac{\partial}{\partial r}\left(\frac{V_{InP}}{m_{QD}}\right)\right|_{r=r_{opt}} = 0.$$

Figure 5:
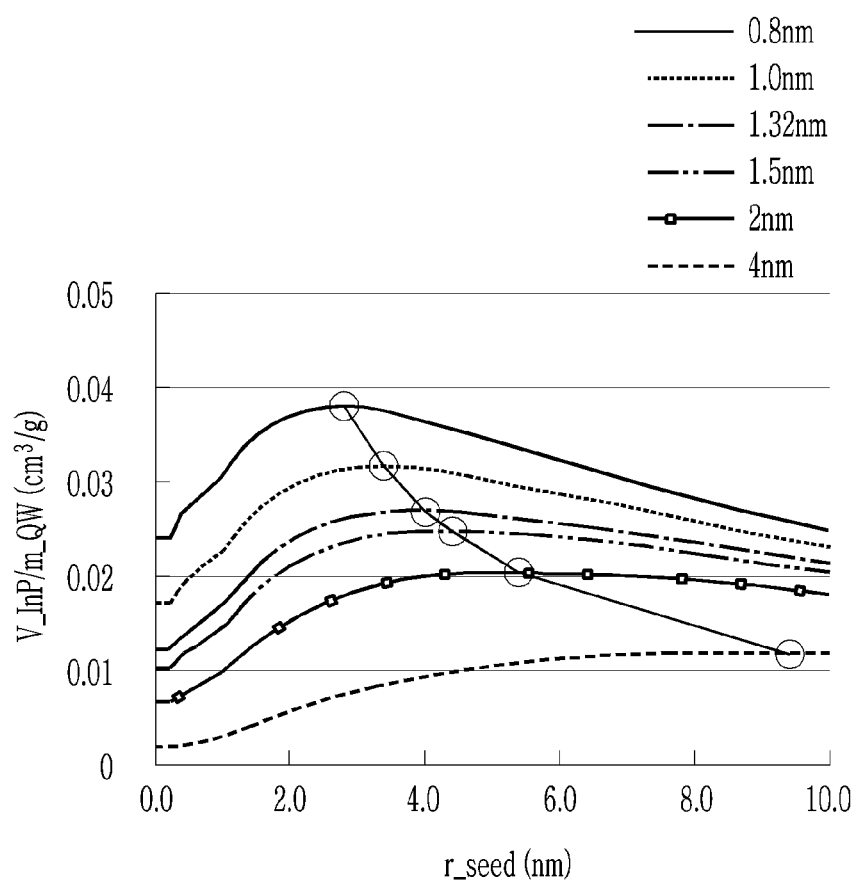
FIG. 5 is a graph of volume per quantum dot unit mass of InP quantum wells (V_InP/m_QW ($cm^3/g$)) versus seed radius in a quantum dot (InP quantum well) (r_seed (nm)) (including a Group III-V semiconductor nanocrystal, for example, an InP quantum well and having a shell of a different thickness) according to an embodiment.

In addition to the equation, the thickness of the shell is changed to 0.8 nm, 1.0 nm, 1.32 nm, 1.5 nm, 2 nm, and 4 nm, respectively, and the volume of the quantum well (e.g., indium phosphide quantum well) per total mass of the quantum dot at each value of the seed radii is plotted in a graph as shown in FIG. 5.

The results of FIG. 5 indicate that with a relatively thinner shell, the volume of the quantum well per unit mass of the quantum dot is increased and the seed radius exhibiting a maximum volume of the quantum well (InP) per mass of quantum dot (hereinafter, optimized seed radius) is decreased, as well. In other words, in the quantum dot according to an embodiment, the optimized seed radius has an approximately direct proportional relationship to the shell thickness of the quantum dot.

It may be desirable for the shell of the quantum dot to have at least a predetermined value of the thickness for protection of the quantum dot.

In quantum dot according to an embodiment, when a thick shell is desired, the seed radius of the quantum dot is also increased (e.g., greater than or equal to about 60% of the shell thickness), and thereby the volume of the quantum well (InP) per unit mass of quantum dot may also increase, which may lead to an increase in a blue light absorption.

Accordingly, in the quantum dot according to an embodiment, a radius of the seed may be greater than or equal to about 60%, for example greater than or equal to about for example, 70%, greater than or equal to about 80%, greater than or equal to about 90%, greater than or equal to about 91%, greater than or equal to about 92%, greater than or equal to about 93%, greater than or equal to about 94%, greater than or equal to about 95%, greater than or equal to about 96%, greater than or equal to about 97%, greater than or equal to about 98%, or greater than or equal to about 99% of the thickness of the shell. In an embodiment, the radius of the seed may be greater than or equal to the thickness of the shell. In an embodiment, the radius of the seed may be greater than or equal to about 1.1 times, greater than or equal to about 1.2 times, greater than or equal to about 1.3 times, greater than or equal to about 1.4 times, greater than or equal to about 1.5 times, greater than or equal to about 1.6 times, greater than or equal to about 1.7 times, greater than or equal to about 1.8 times, greater than or equal to about 1.9 times, or greater than or equal to 2 times of the thickness of the shell.

In an embodiment, the radius of the seed may be less than or equal to about 3 times, less than or equal to about 2.5 times, less than or equal to about 2 times, less than or equal to about 1.9 times, less than or equal to about 1.8 times, less than or equal to about 1.7 times, less than or equal to about 1.6 times, less than or equal to about 1.5 times, less than or equal to about 1.4 times, less than or equal to about 1.3 times, less than or equal to about 1.2 times, or less than or equal to about 1.1 times of the thickness of the shell.

The (average) size of the quantum dot may be greater than or equal to about 1 nm, greater than or equal to about 2 nm, greater than or equal to about 3 nm, greater than or equal to about 4 nm, or greater than or equal to about 5 nm. When the quantum dot emits red light or green light, the size of the quantum dot may be less than or equal to about 50 nm, less than or equal to about for example, about 40 nm, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 15 nm, less than or equal to about 14 nm, less than or equal to about 13 nm, less than or equal to about 12 nm, less than or equal to about 11 nm, less than or equal to about 10 nm, less than or equal to about 9 nm, less than or equal to about 8 nm, or less than or equal to about 7 nm. The size of the quantum dot may be a particle diameter. The quantum dot may not have a spherical shape, and the size of the quantum dot may be a diameter (e.g., equivalent diameter), which is calculated from the two-dimensional area confirmed by a transmission electron microscope analysis.

When the quantum dot emits green (or red) light, the (average) size of the quantum dot may be greater than or equal to about 5.5 nm, greater than or equal to about 6 nm, greater than or equal to about 6.2 nm, greater than or equal to about 6.5 nm, greater than or equal to about 6.7 nm, or greater than or equal to about 6.9 nm.

A shape of the quantum dot is not particularly limited, may for example be a spherical, polyhedron, pyramid, multipod, or cube shape, nanotube, nanowire, nanofiber, nanosheet, or a combination thereof, but is not limited thereto.

The quantum dot may include an organic ligand, an organic solvent, or a combination thereof which will be described below, on a surface of the quantum dot. The organic ligand, the organic solvent, or the combination thereof may be bound to the surface of the quantum dot.

The non-cadmium quantum dot may be produced by providing a seed including a first semiconductor nanocrystal and having a size within the aforementioned range and forming a quantum well including the second semiconductor nanocrystal with a desired (or predetermined) thickness on a surface of the seed; and forming a shell including a third semiconductor nanocrystal with a desired (or predetermined) thickness on the formed quantum well.

The details of the seed, the quantum well, and the shell are the same as described above. Hereinafter, a method of producing a quantum dot including a zinc selenide-containing seed, an indium phosphide-containing quantum well, and a zinc, sulfur, and optionally selenide-containing shell will be described, but is not limited thereto.

In order to obtain a seed, a zinc precursor and a selenium precursor are reacted in an organic solvent in the presence of an organic ligand. The method may include separating the obtained seed from the organic solvent.

In order to form the quantum well on the seed, in the presence of an organic ligand and the seed, an indium precursor and a phosphorus precursor may be reacted in an organic solvent. The forming of the quantum well may further include determining a thickness of the quantum well considering the desirable photoluminescence wavelength and calculating an appropriate amount of precursor.

In order to form the shell on the quantum well, in the presence of an organic ligand and a particle with the quantum well formed thereon, a zinc precursor, and a selenium precursor, a sulfur precursor, or a combination thereof may be reacted. The forming of a shell may include calculating a desired shell thickness considering a seed size (e.g., a radius of the seed) and optionally a desired photoluminescence wavelength and selecting an appropriate amount of a precursor and reaction temperature for the desired shell thickness.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR, $RPO(OH)_2$, RPOOH, $R_2POOH$ (wherein, R is the same or different and independently a substituted or unsubstituted C1 to C24 aliphatic hydrocarbon (e.g., a C1 to C24 alkyl group, a C2 to C24 alkenyl group, a C2 to C24 alkynyl group), a substituted or unsubstituted C6 to C20 aromatic hydrocarbon (e.g., a C6 to C20 aryl group), or a combination thereof, provided that at least one R is not hydrogen), or a combination thereof.

The organic ligand may coordinate with, e.g., be bound to, the surface of the obtained nanocrystal and may assist the nanocrystal to be well dispersed in the solution, affect photoluminescence and electrical characteristics of quantum dots, or a combination thereof.

Examples of the organic ligand may include methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphine such as substituted or unsubstituted methyl phosphine (e.g., trimethyl phosphine, methyldiphenyl phosphine, etc.), substituted or unsubstituted ethyl phosphine (e.g., triethyl phosphine, ethyldiphenyl phosphine, etc.), substituted or unsubstituted propyl phosphine, substituted or unsubstituted butyl phosphine, substituted or unsubstituted pentyl phosphine, or substituted or unsubstituted octylphosphine (e.g., trioctylphosphine (TOP)); phosphine oxide such as substituted or unsubstituted methyl phosphine oxide (e.g., trimethyl phosphine oxide, methyldiphenyl phosphine oxide, etc.), substituted or unsubstituted ethyl phosphine oxide (e.g., triethyl phosphine oxide, ethyldiphenyl phosphine oxide, etc.), substituted or unsubstituted propyl phosphine oxide, substituted or unsubstituted butyl phosphine oxide, or substituted or unsubstituted octyl phosphine oxide (e.g., trioctylphosphine oxide (TOPO)); diphenyl phosphine, triphenyl phosphine compound, or an oxide compound thereof; phosphonic acid, and the like, but are not limited thereto. The organic ligand may be used alone or as a mixture of two or more.

The solvent may be a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; a phosphine substituted with a C6 to C22 alkyl group such as trioctylphosphine; a phosphine oxide substituted with a C6 to C22 alkyl group such as trioctylphosphine oxide; a C12 to C22 aromatic ether such as phenyl ether, or benzyl ether, or a combination thereof. Types and amounts of the solvent may be appropriately selected considering precursors and organic ligands.

The precursor is not particularly limited and may be selected appropriately. In an embodiment, the zinc precursor may be selected appropriately. Examples of the zinc precursor may be a Zn metal powder (e.g., dimethylzinc, diethylzinc, etc.), an alkylated Zn compound, a Zn alkoxide, a Zn carboxylate, a Zn nitrate, Zn perchlorate, Zn sulfate, Zn acetylacetonate, Zn halide, Zn cyanide, Zn hydroxide, Zn oxide, Zn peroxide, or a combination thereof. The zinc precursor may be used alone or in a combination of two or more.

The indium precursor may be selected appropriately. Examples of the indium precursor may be trimethyl indium, indium carboxylate such as indium acetate, indium hydroxide, indium chloride, indium oxide, indium nitrate, indium sulfate, or a combination thereof.

The phosphorus precursor may be selected appropriately. Examples of the phosphorus precursor may be tris(trimethylsilyl)phosphine, tris(dimethylamino) phosphine, triethylphosphine, tributylphosphine, trioctylphosphine, triphenylphosphine, tricyclohexylphosphine, or a combination thereof.

The sulfur precursor may be selected appropriately. Examples of the sulfur precursor may be hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-(S-TOA), bistrimethylsilyl sulfur, ammonium sulfide, sodium sulfide, or a combination thereof.

The types/amounts of the precursors may be determined considering the compositions of the final quantum dot and reactivity between precursors.

The first mixture may be heated at a predetermined temperature, for example, greater than or equal to about 100° C., greater than or equal to about 120° C., greater than or equal to about 150° C., greater than or equal to about 200° C., greater than or equal to about 250° C., or greater than or equal to about 270° C. for example, under vacuum, inert atmosphere, or a combination thereof as desired.

The reaction conditions such as reaction temperatures, times, and the like for forming a seed, a quantum well, and a shell may not be particularly limited but may be appropriately selected. In an embodiment, a solvent and a metal precursor optionally together with a ligand compound are heated (or evaporated under vacuum) at a predetermined temperature (e.g., greater than or equal to about 100° C.) and an inert gas atmosphere is provided and heated again at a predetermined temperature (e.g., greater than or equal to about 100° C.). Subsequently, non-metal precursors are sequentially or simultaneously added thereto and heated at a predetermined reaction temperature to perform a reaction. When forming the multi-layered shell, the metal precursors, non-metal precursors, or a combination thereof for the shell may be added thereto for several times during the reaction time at different ratios. The reaction temperature may be appropriately selected, but is not particularly limited. For example, the reaction temperature for forming a seed, a shell, or a combination thereof may be greater than or equal to about 260° C., greater than or equal to about 270° C., greater than or equal to about 280° C., greater than or equal to about 290° C., greater than or equal to about 295° C. and less than or equal to about 340° C., for example, less than or equal to about 335° C., less than or equal to about 330° C., or less than or equal to about 325° C. The reaction temperature for forming a quantum well may be greater than or equal to about 260° C., greater than or equal to about 270° C., greater than or equal to about 280° C., greater than or equal to about 290° C., or greater than or equal to about 295° C. and less than or equal to about 340° C., for example, less than or equal to about 335° C., less than or equal to about 330° C., or less than or equal to about 325° C.

When the non-solvent is added into the obtained final reaction solution, the organic ligand-coordinated nanocrystal may be separated (e.g., precipitated). The non-solvent may be a polar solvent that is miscible with the solvent used in the reaction and nanocrystals may not be dispersible therein. The non-solvent may be selected depending on the solvent used in the reaction and may be for example, acetone, ethanol, butanol, isopropanol, ethanediol, water, tetrahydrofuran (THF), dimethyl sulfoxide (DMSO), diethyl ether, formaldehyde, acetaldehyde, a solvent having a similar solubility parameter to the foregoing solvents, or a combination thereof. The separation may be performed through, e.g., using, a centrifugation, precipitation, chromatography, or distillation. The separated nanocrystal may be added to a washing solvent and washed, if desired. The washing solvent has no particular limit and may have a similar solubility parameter to that of the ligand and may, for example, include hexane, heptane, octane, chloroform, toluene, benzene, and the like.

An amount of the quantum dot in the composition may be desirably adjusted considering a desirable final use (e.g., color filter, etc.). In an embodiment, the amount of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a solid content of the composition. The amount of the quantum dot may be less than or equal to about 70 wt %, for example, less than or equal to about 65 wt %, less than or equal to about 60 wt %, less than or equal to about 55 wt %, less than or equal to about 50 wt %, or less than or equal to about 45 wt %, based on a solid content of the composition.

The composition according to an embodiment may be used to produce a quantum dot-polymer composite pattern. The composition according to an embodiment may be a quantum dot-containing photoresist composition to which a photolithography method may be applied. The composition according to an embodiment may be an ink composition that may provide a pattern by printing (e.g., a droplet discharge method such as inkjet printing). The composition according to an embodiment may not include a conjugated polymer (except a cardo binder resin that will be described below). The composition according to an embodiment may include a conjugated polymer. Herein, the conjugated polymer may refer to a polymer having a conjugation double bond in the main chain of the conjugated polymer (e.g., polyphenylenevinylene, etc.).

In the composition according to an embodiment, a dispersing agent that may aid with dispersion of the quantum dot may be included. In an embodiment, the dispersing agent may be a binder polymer. The binder polymer may include a carboxylic acid group. The binder polymer may include a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a multiple aromatic ring-containing polymer having a backbone structure wherein two aromatic rings are bound to a quaternary carbon atom that is a constituent atom of another cyclic moiety in the main chain and including a carboxylic acid group (—COOH) (hereinafter, a cardo binder resin); or a combination thereof.

The copolymer includes a first repeating unit derived from the first monomer and a second repeating unit derived from the second monomer, and optionally a third repeating unit derived from the third monomer.

Examples of the first monomer may include carbonic acid vinyl ester compounds such as acrylic acid, methacrylic acid, maleic acid, itaconic acid, fumaric acid, 3-butenoic acid, vinyl acetate, or vinyl benzoate, but are not limited thereto. The first monomer may include at least one compound.

Examples of the second monomer may be an alkenyl aromatic compound such as styrene, alpha-methyl styrene, vinyl toluene, or vinyl benzyl methyl ether; a unsaturated carbonic acid ester compound such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate; unsaturated carbonic acid amino alkyl ester compound such as 2-amino ethyl acrylate, 2-amino ethyl methacrylate, 2-dimethyl amino ethyl acrylate, or 2-dimethyl amino ethyl methacrylate; maleimides such as N-phenylmaleimide, N-benzylmaleimide, N-alkylmaleimide; a unsaturated carbonic acid glycidyl ester compound such as glycidyl acrylate or glycidyl methacrylate; a vinyl cyanide compound such as acrylonitrile, methacrylonitrile; or a unsaturated amide compound such as acryl amide or methacryl amide, but are not limited thereto. As the second monomer, at least one compound may be used.

Specific examples of the third monomer may include 2-hydroxy ethyl acrylate, 2-hydroxy ethyl methacrylate, 2-hydroxy butyl acrylate, or 2-hydroxy butyl methacrylate, but are not limited thereto. As the third monomer, at least one compound may be used.

In the carboxylic acid polymer (hereinafter, also referred to as a binder including a carboxy group), an amount of the first repeating unit may be greater than or equal to about 10 mole percent (mol %), for example, greater than or equal to about 15 mol %, greater than or equal to about 25 mol %, or greater than or equal to about 35 mol %. In the binder including a carboxyl group, an amount of the first repeating unit may be less than or equal to about 90 mol %, for example, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the carboxylic acid polymer, an amount of the second repeating unit may be greater than or equal to about 10 mol %, greater than or equal to about for example, 15 mol %, greater than or equal to about 25 mol %, or greater than or equal to about 35 mol %. In the binder polymer, an amount of the second a repeating unit may be less than or equal to about 90 mol %, for example, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the carboxylic acid polymer, an amount of the third repeating unit may be greater than or equal to about 1 mol %, for example, greater than or equal to about 5 mol %, greater than or equal to about 10 mol % or greater than or equal to about 15 mol %, if present. In the binder polymer, an amount of the third repeating unit may be less than or equal to about 30 mol %, for example, less than or equal to about 25 mol %, less than or equal to about 20 mol %, less than or equal to about 18 mol %, less than or equal to about 15 mol %, or less than or equal to about 10 mol %.

The carboxylic acid polymer may be a copolymer of (meth)acrylic acid; and at least one second/third monomer of arylalkyl(meth)acrylate, hydroxyalkyl (meth)acrylate, and styrene. For example, the binder polymer may be a methacrylic acid/methyl methacrylate copolymer, a methacrylic acid/benzyl methacrylate copolymer, a methacrylic acid/benzyl methacrylate/styrene copolymer, a methacrylic acid/benzyl methacrylate/2-hydroxy ethyl methacrylate copolymer, or a methacrylic acid/benzyl methacrylate/styrene/2-hydroxy ethyl methacrylate copolymer.

The polymer including the carboxylic acid group may include a multiple aromatic ring-containing polymer. The multiple aromatic ring-containing polymer is known as a cardo binder resin and may be commercially available.

The polymer including the carboxylic acid may have an acid value of greater than or equal to about 50 milligrams of potassium hydroxide per gram (mg KOH/g). For example, the carboxylic acid polymer may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g. The acid value of the polymer may be for example less than or equal to about 250 mg KOH/g, less than or equal to about for example, 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto.

The binder polymer may have a weight average molecular weight of greater than or equal to about 1,000 grams per mole (g/mol), for example, greater than or equal to about 2,000 g/mol, greater than or equal to about 3,000 g/mol, or greater than or equal to about 5,000 g/mol. The binder polymer may have a weight average molecular weight of less than or equal to about 100,000 g/mol, for example less than or equal to about 50,000 g/mol.

In the composition, an amount of the binder polymer may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on a total weight of the composition, but is not limited thereto. The amount of the binder polymer may be less than or equal to about 35 wt %, for example less than or equal to about 33 wt %, or less than or equal to about 30 wt %, based on a total weight of the composition. Within the ranges, dispersion of the quantum dot may be improved, e.g., ensured. The amount of the binder polymer may be about 0.5 wt % to about 55 wt %, based on a total weight of a solid of the composition.

In the composition, the polymerizable (e.g., photopolymerizable) monomer including the carbon-carbon double bond may include a (e.g., photopolymerizable) acryl-based monomer. The monomer may be a precursor for an insulating polymer. The acryl-based monomer may include a (C1-C12 alkyl) (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentylglycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, pentaerythritol hexa(meth)acrylate, bisphenol A di(meth)acrylate, bisphenol A epoxy acrylate, trimethylolpropane tri(meth)acrylate, ethylene glycol monomethylether (meth)acrylate, novolac epoxy (meth)acrylate, diethylene glycol di(meth)acrylate, triethylene glycol di(meth)acrylate, propylene glycol di(meth)acrylate, tris(meth)acryloyloxyethyl phosphate, or a combination thereof.

An amount of the monomer may be greater than or equal to about 0.5 wt %, for example, greater than or equal to about 1 wt % or greater than or equal to about 2 wt %, based on a total weight of the composition. The amount of the photopolymerizable monomer may be less than or equal to about 30 wt %, less than or equal to about for example, 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %, based on a total weight of the composition.

The initiator (or photoinitiator) in the composition may be used for polymerization of the monomers. The initiator is a compound accelerating a radical reaction (e.g., radical polymerization of monomer) by producing radical chemical species under a mild condition (e.g., by heat or light). The initiator may be a thermal initiator or a photo initiator. The initiator (or photoinitiator) may be a compound that may initiate a radical polymerization of the polymerizable acryl monomer, a thiol compound (will be described below), or a combination thereof by light. The initiator is not particularly limited. The initiator may be a thermal initiator. The thermal initiator may include azobisisobutyronitrile, benzoyl peroxide, and the like, but is not limited thereto. The initiator may be a photoinitiator. The photoinitiator may include a triazine-based compound, an acetophenone compound, a benzophenone compound, a thioxanthone compound, a benzoin compound, an oxime ester compound, an aminoketone compound, a phosphine or phosphine oxide compound, a carbazole-based compound, a diketone compound, a sulfonium borate-based compound, a diazo-based compound, a biimidazole-based compound, or a combination thereof, but is not limited thereto.

In the composition, an amount of the initiator may be appropriately adjusted considering types and amounts of the polymerizable monomers. In an embodiment, the initiator may be used in an amount range of about 0.01 wt % to about 10 wt %, based on a total weight of the composition, but is not limited thereto.

The composition may further include a (multiple or mono-functional) thiol compound having a thiol group at a terminal end of the compound, a metal oxide particulate, or a combination thereof.

The metal oxide particulate may include $TiO_2$, $SiO_2$, $BaTiO_3$, $Ba_2TiO_4$, ZnO, or a combination thereof. In the composition, an amount of the metal oxide may be less than or equal to about 15 wt %, based on that of a solid in the composition. The metal oxide particulate may have an appropriately selected diameter without a particular limit. The diameter of the metal oxide particulate may be greater than or equal to about 100 nm, for example, greater than or equal to about 150 nm, or greater than or equal to about 200 nm and less than or equal to about 1,000 nm or less than or equal to about 800 nm.

The multiple thiol compound may include a compound represented by Chemical Formula 1:

Chemical Formula 1

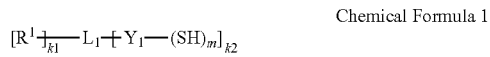

wherein, in Chemical Formula 1, $R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted C1 to C30 amine group (—NRR', wherein R and R' are independently hydrogen or a C1 to C30 linear or branched alkyl group provided that both are not simultaneously hydrogen); an isocyanate group; a halogen; —ROR' (wherein R is a substituted or unsubstituted C1 to C20 alkylene group and R' is hydrogen or a C1 to C20 linear or branched alkyl group); an acyl halide (—RC(=O)X, wherein R is a substituted or unsubstituted alkylene group and X is a halogen); —C(=O)OR' (wherein R' is hydrogen or a C1 to C20 linear or branched alkyl group); —ON; C(=O)NRR', or —C(=O)ONRR' (wherein R and R' are independently hydrogen or a C1 to C20 linear or branched alkyl group), $L_1$ is a carbon atom, a substituted or unsubstituted C1 to C30 alkylene group, a substituted or unsubstituted C3 to C30 cycloalkylene group, a substituted or unsubstituted C6 to C30 arylene group, or a substituted or unsubstituted C3 to C30 heteroarylene group, wherein methylene (—$CH_2$—) of the substituted C1 to C30 alkylene group may be replaced by sulfonyl (—$SO_2$—), carbonyl (CO), ether (—O—), sulfide (—S—), sulfoxide (—SO—), ester (—C(=O)O—), an amide (—C(=O)NR—) (wherein R is hydrogen or a C1 to C10 alkyl group) or a combination thereof, $Y_1$ is a single bond; a substituted or unsubstituted C1 to C30 alkylene group; a substituted or unsubstituted C2 to C30 alkenylene group; a C1 to C30 alkylene group or a C2 to C30 alkenylene group wherein at least one methylene (—$CH_2$—) is replaced by sulfonyl (—S(=O)$_2$—), carbonyl (—C(=O)—), ether (—O—), sulfide (—S—), sulfoxide (—S(=O)—), ester(—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is an integer of 0 or 1 or more, k2 is an integer of 1 or more, a sum of m and k2 is an integer of 3 or more, when $Y_1$ is not a single bond, m does not exceed a valence of $Y_1$, and a sum of k1 and k2 does not exceed a valence of $L_1$.

The multiple thiol compound may include a compound represented by Chemical Formula 1-1:

Chemical Formula 1-1

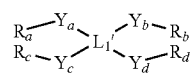

wherein, $L_1'$ is carbon, a substituted or unsubstituted C2 to C20 alkylene group, a substituted or unsubstituted C6 to C30 arylene group; a substituted or unsubstituted C3 to C30 heteroarylene group; a substituted or unsubstituted C3 to C30 cycloalkylene group; a substituted or unsubstituted C3 to C30 heterocycloalkylene group, $Y_a$ to $Y_d$ are independently, direct bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene (—$CH_2$—) is replaced by sulfonyl (—S(=O)$_2$—), carbonyl (—C(=O)—), ether (—O—), sulfide (—S—), sulfoxide (—S(=O)—), ester(—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, $R_a$ to $R_d$ are independently $R^1$ of Chemical Formula 1 or SH, provided that at least two of $R_a$ to $R_d$ are SH.

The thiol compound may be a dithiol compound, a trithiol compound, tetrathiol compound, or a combination thereof. For example, the thiol compound may be glycoldi-3-mercaptopropionate, glycol dimercapto acetate, trimethylolpropane tris(3-mercaptopropionate), pentaerythritol tetrakis (3-mercaptopropionate), pentaerythritol tetrakis (2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

An amount of the thiol compound may be less than or equal to about 10 wt %, for example less than or equal to about 9 wt %, less than or equal to about 8 wt %, less than or equal to about 7 wt %, less than or equal to about 6 wt %, or less than or equal to about 5 wt %, based on a total weight of the composition. The amount of the thiol compound may be greater than or equal to about 0.1 wt %, for example, greater than or equal to about 0.5 wt % or greater than or equal to about 1 wt %, based on a total weight of the composition.

The composition may further include an organic solvent (or a liquid vehicle). Types of the usable organic solvent are not particularly limited. A type and an amount of the organic solvent may be appropriately determined by considering the above main components (i.e., the quantum dot, the dispersing agent, the polymerizable monomer, the initiator, and if used, the thiol compound) and a type and an amount of an additive which is described below. The composition may include a solvent in a residual amount except for a desired amount of the (non-volatile) solid. Examples of the solvent (or liquid vehicle) may include ethylene glycols such as ethyl 3-ethoxy propionate, ethylene glycol, diethylene glycol, or polyethylene glycol; glycol ethers such as ethylene glycol monomethylether, ethylene glycol monoethylether, diethylene glycol monomethylether, ethylene glycol diethylether, or diethylene glycol dimethylether; glycol ether acetates such as ethylene glycol acetate, ethylene glycol monoethyl ether acetate, diethylene glycol monoethyl ether acetate, or diethylene glycol monobutyl ether acetate; propylene glycol such as propylene glycol; propylene glycol ethers such as propylene glycol monomethylether, propylene glycol monoethylether, propylene glycol monopropylether, propylene monobutyl ether, propylene glycol dimethylether, dipropylene glycol dimethylether, propylene glycol diethylether, or dipropylene glycol diethylether; propylene glycol ether acetates such as propylene glycol monomethyl ether acetate, or dipropylene glycol monoethyl ether acetate; amides such as N-methylpyrrolidone, dimethyl formamide, or dimethyl acetamide; ketones such as methylethylketone (MEK), methylisobutylketone (MIBK), or cyclohexanone; petroleums such as toluene, xylene, or solvent naphtha; esters such as ethyl acetate, butyl acetate, or ethyl lactate; ethers such as diethyl ether, dipropyl ether, or dibutyl ether; aliphatic, alicyclic, or aromatic hydrocarbons, or a combination thereof.

If desired, the composition may further include various additives such as a light diffusing agent, a leveling agent, or a coupling agent in addition to the components. The amount of the additive is not particularly limited, and may be controlled within an appropriate range wherein the additive may not cause an adverse effect on preparation of the composition and production of the quantum dot-polymer composite and optionally a patterning of the composite.

If used, the additives may be used in an amount of greater than or equal to about 0.1 wt %, for example, greater than or equal to about 0.5 wt %, greater than or equal to about 1 wt %, greater than or equal to about 2 wt %, or greater than or equal to about 5 wt %, based on a total weight of the composition, but is not limited thereto. If used, the amount of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt %, based on a total weight of the composition, but is not limited thereto.

The composition according to an embodiment may be prepared by a method including: preparing quantum dot dispersion including the non-cadmium quantum dot, the dispersing agent, and the organic solvent; and mixing the quantum dot dispersion with the initiator; the polymerizable monomer (e.g., acryl-based monomer); optionally the thiol compound; optionally the metal oxide particulate, and optionally the additives. Each component may be mixed sequentially or simultaneously, but mixing orders are not particularly limited.

The composition may provide a quantum dot-polymer composite by a (e.g., radical) polymerization.

Accordingly, in an embodiment, the quantum dot-polymer composite includes a polymer matrix; and the non-cadmium quantum dot dispersed in the polymer matrix. The polymer matrix may include a dispersing agent (e.g., a binder polymer including a carboxylic acid group), a polymerization product (e.g., insulating polymer) of a polymerizable monomer having a carbon-carbon double bond (at least one carbon-carbon double bond, for example, at least two, at least three, at least four, or at least five carbon-carbon double bonds), optionally a polymerization product of the polymerizable monomer and a multiple thiol compound having at least two thiol groups at a terminal end of the multiple thiol compound, a metal oxide particulate(s), or a combination thereof.

In an embodiment, the polymer matrix may include a cross-linked polymer and a dispersing agent (e.g., (carboxyl group-contained) binder polymer). The polymer matrix may not include a conjugated polymer (except for a cardo binder resin). The cross-linked polymer may include a thiolene resin, a cross-linked poly(meth)acrylate, or a combination thereof. In an embodiment, the cross-linked polymer may be a polymerization product of the polymerizable monomer and, optionally, the multiple thiol compound.

Details of the non-cadmium quantum dot, the dispersing agent, or the binder polymer, the polymerizable monomer, and the multiple thiol compound are the same as described above.

The film of the quantum dot polymer composite or the quantum dot polymer composite pattern that will be described below may have for example a thickness, less than or equal to about 30 µm, for example less than or equal to about 25 µm, less than or equal to about 20 µm, less than or equal to about 15 µm, less than or equal to about 10 µm, less than or equal to about 8 µm, less than or equal to about 7 µm and greater than about 2 µm, for example, greater than or equal to about 3 µm, greater than or equal to about 3.5 µm, or greater than or equal to about 4 µm.

In an embodiment, patterned film includes a repeating section including a first section emitting a first light, wherein the first section includes the quantum dot polymer composite. The repeating section may include a second section emitting a second light having different wavelength from the first light, wherein the second section may include a quantum dot polymer composite. The quantum dot polymer composite of the second section may include a second quantum dot configured to emit the second light. The second quantum dot may include the non-cadmium quantum dot. The first light or the second light may be red light having a maximum photoluminescence peak wavelength which is present between about 600 nm and about 650 nm (e.g., about 620 nm to about 650 nm) or green light having a maximum photoluminescence peak wavelength which is present between about 500 nm and about 550 nm (e.g., about 510 nm to about 540 nm). The patterned film may further include a third section emitting or passing a third light (e.g., blue light)

different from the first light and the second light. The third light may have a maximum peak wavelength ranging from 380 nm to 480 nm.

In an embodiment, a display device includes a light source and a photoluminescence element, and the photoluminescence element includes a substrate and an emission layer disposed on the substrate, and the emission layer includes a film or patterned film of the quantum dot polymer composite. The light source is configured to provide the photoluminescence element with incident light. The incident light may have a photoluminescence peak wavelength of greater than or equal to about 440 nm, for example, greater than or equal to about 450 nm and less than or equal to about 500 nm, for example, less than or equal to about 480 nm, less than or equal to about 470 nm, or less than or equal to about 460 nm.

In the emission layer (e.g., patterned film of quantum dot polymer composite) of the device according to an embodiment, the first section may be a section emitting red light, and the second section may be a section emitting green light, and the light source may be an element emitting blue light.

Optical elements (blue light blocking layer or first optical filter which will be described below) for blocking (e.g., reflecting or absorbing) blue light may be disposed on front surfaces (light-emitting surfaces) of the first section and the second section.

In the display device, the light source includes a plurality of light emitting units respectively corresponding to the first section and the second section, and the light emitting units may include a first electrode and a second electrode facing each other and an electroluminescence layer disposed between the first electrode and the second electrode. The electroluminescence layer may include an organic light emitting material. For example, each light emitting unit of the light source may include an electroluminescent device (e.g., an organic light emitting diode (OLED)) structured to emit light of a predetermined wavelength (e.g., blue light, green light, or a combination thereof). Structures and materials of the electroluminescent device and the organic light emitting diode (OLED) are not particularly limited. The light source may include an organic light emitting diode (OLED) emitting blue light (and optionally, green light).

Figure 6:
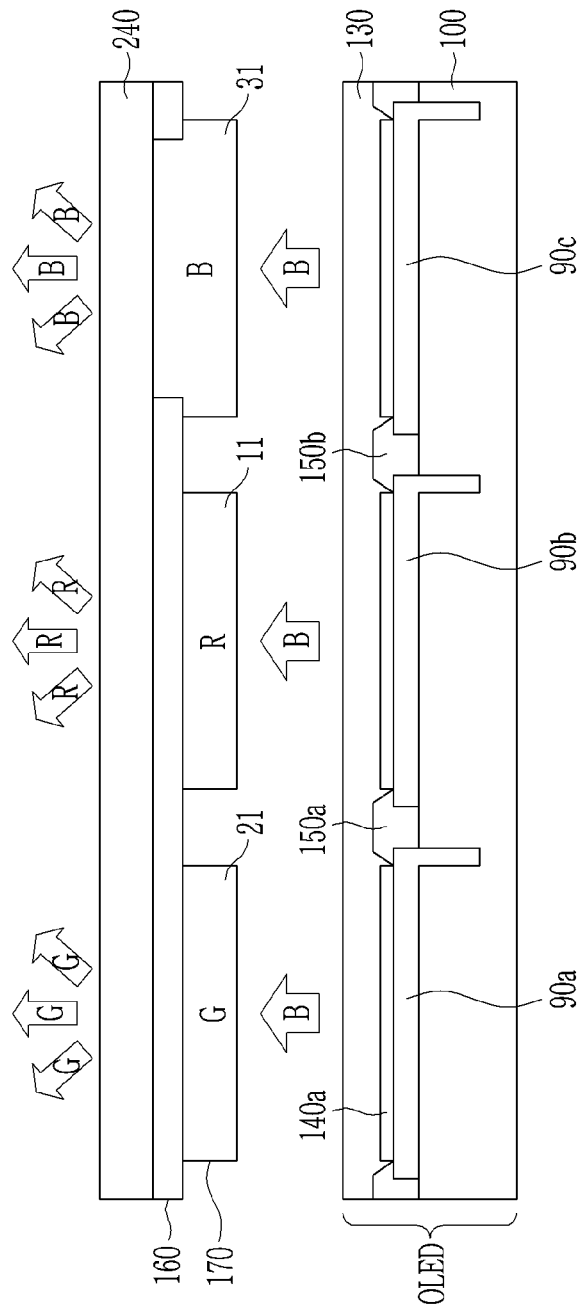
FIG. 6 is a schematic cross-sectional view of a device according to an embodiment.
Figure 7:
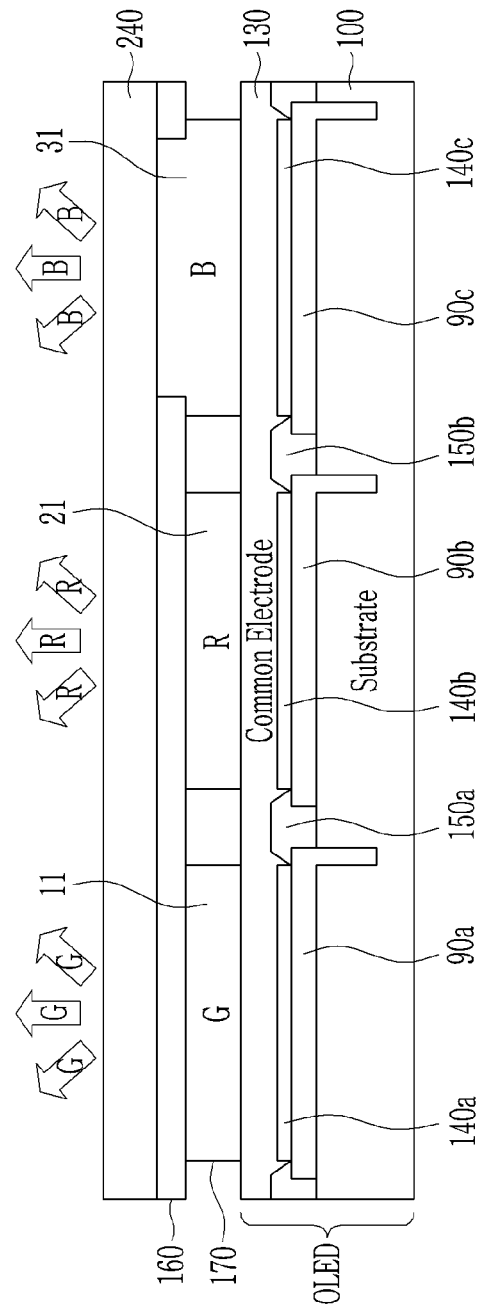
FIG. 7 is a schematic cross-sectional view of a device according to an embodiment.

FIGS. 6 and 7 are schematic cross-sectional views of display devices according to embodiments. Referring to FIGS. 6 and 7, a light source includes an organic light emitting diode (OLED) emitting blue light. The organic light emitting diode OLED may include (at least two, for example, at least three) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode layer 130 formed on the organic light emitting layer 140a, 140b, 140c.

A thin film transistor and a substrate may be disposed under the organic light emitting diode (OLED). The pixel areas of the OLED may be disposed corresponding to the first, second, and third sections that will be described in detail below, respectively.

A stack structure including a quantum dot polymer composite (e.g., first section including red quantum dot and second section including green quantum dot) pattern and a substrate may be disposed on the light source. Blue light emitted from the light source may enter into the first section and the second section to emit red light and green light, respectively. Blue light emitted from the light source may pass through the third section.

The light (e.g., blue light) emitted from the light source may enter the second section 21 and the first section 11 of the pattern 170 to emit (e.g., converted) red light R and green light G, respectively. The blue light B emitted from the light source passes through or transmits from the third section 31. Over the second section 21 emitting red light, the first section 11 emitting green light, or a combination thereof, an optical element 160 may be disposed. The optical element may be a blue cut layer which cuts (e.g., reflects or absorbs) blue light and optionally green light, or a first optical filter. The blue cut layer 160 may be disposed on the upper substrate 240. The blue cut layer 160 may be disposed between the upper substrate 240 and the quantum dot-polymer composite pattern and over the first section 11 and the second section 21. Details of the blue cut layer are the same as set forth for the first optical filter 310 below.

The device may be obtained by separately fabricating the stack structure and (e.g., blue light emitting) LED or OLED and then assembling the same. The device may be obtained by forming a quantum dot polymer composite pattern directly on the LED or OLED.

The substrate may be a substrate including an insulating material. The substrate may include glass; various polymers such as polyester of polyethylene terephthalate (PET), or polyethylene naphthalate (PEN), polycarbonate, and polyacrylate; polysiloxane (e.g., PDMS); an inorganic material such as $Al_2O_3$ or ZnO; or a combination thereof, but is not limited thereto. A thickness of the substrate may be selected appropriately considering a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dot.

A wire layer including a thin film transistor or the like is formed on the substrate. The wire layer may further include a gate line, a sustain voltage line, a gate insulating layer, a data line, a source electrode, a drain electrode, a semiconductor, a protective layer, and the like. The detail structure of the wire layer may be verified according to an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described below.

The pixel electrode may function as an anode of the display device. The pixel electrode may be formed of a transparent conductive material such as indium tin oxide (ITO) or indium zinc oxide (IZO). The pixel electrode may be formed of a material having a light-blocking properties such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure wherein the transparent conductive material and the material having light-blocking properties are stacked sequentially.

Between two adjacent pixel electrodes, a pixel define layer (PDL) may overlap with a terminal end of the pixel electrode to divide the pixel electrode into a pixel unit. The pixel define layer is an insulation layer which may electrically block the at least two pixel electrodes.

The pixel define layer covers a part of the upper surface of the pixel electrode, and the remaining region of the pixel electrode not covered by the pixel define layer may provide an opening. An organic emission layer that will be described below may be formed on the region defined by the opening.

The organic emission layer defines each pixel area by the pixel electrode and the pixel define layer. In other words, one pixel area may be defined as an area formed with one organic emission unit layer which is contacted with one pixel electrode divided by the pixel define layer.

For example, in the display device according to an embodiment, the organic emission layer may be defined as a first pixel area, a second pixel area and a third pixel area, and each pixel area is spaced apart from each other leaving a predetermined interval by the pixel define layer.

In an embodiment, the organic emission layer may emit a third light belonging to a visible light region or belonging to an ultraviolet (UV) region. That is, each of the first to the third pixel areas of the organic emission layer may emit a third light. In an embodiment, the third light may be a light having the highest energy in the visible light region, for example, may be blue light. When all pixel areas of the organic emission layer are designed to emit the same light, each pixel area of the organic emission layer may be all formed of the same or similar materials or may exhibit the same or similar properties. Thus the organic emission layer may be formed relatively easier, and the display device may be formed using a large scale/large area process. However, the organic emission layer according to an embodiment is not necessarily limited thereto, but the organic emission layer may be designed to emit at least two different lights, e.g., two differently colored lights.

The organic emission layer includes an organic emission unit layer in each pixel area, and the each organic emission unit layer may further include an auxiliary layer (e.g., hole injection layer (HIL), hole transport layer (HTL), electron transport layer (ETL), etc.) besides the emission layer.

The common electrode may function as a cathode of the display device. The common electrode may be formed of a transparent conductive material such as indium tin oxide (ITO) or indium zinc oxide (IZO). The common electrode may be formed on the organic emission layer and may be integrated with the organic emission layer.

A planarization layer or a passivation layer may be formed on the common electrode. The planarization layer may include a (e.g., transparent) insulating material for ensuring electrical insulation with the common electrode.

In an embodiment, the display device may further include a lower substrate, a polarizer disposed under the lower substrate, and a liquid crystal layer disposed between the stack structure and the lower substrate, and in the stack structure, the light emission layer may be disposed to face the liquid crystal layer. The display device may further include a polarizer between the liquid crystal layer and the emission layer. The light source may further include LED and if desired, a light guide panel.

Figure 8:
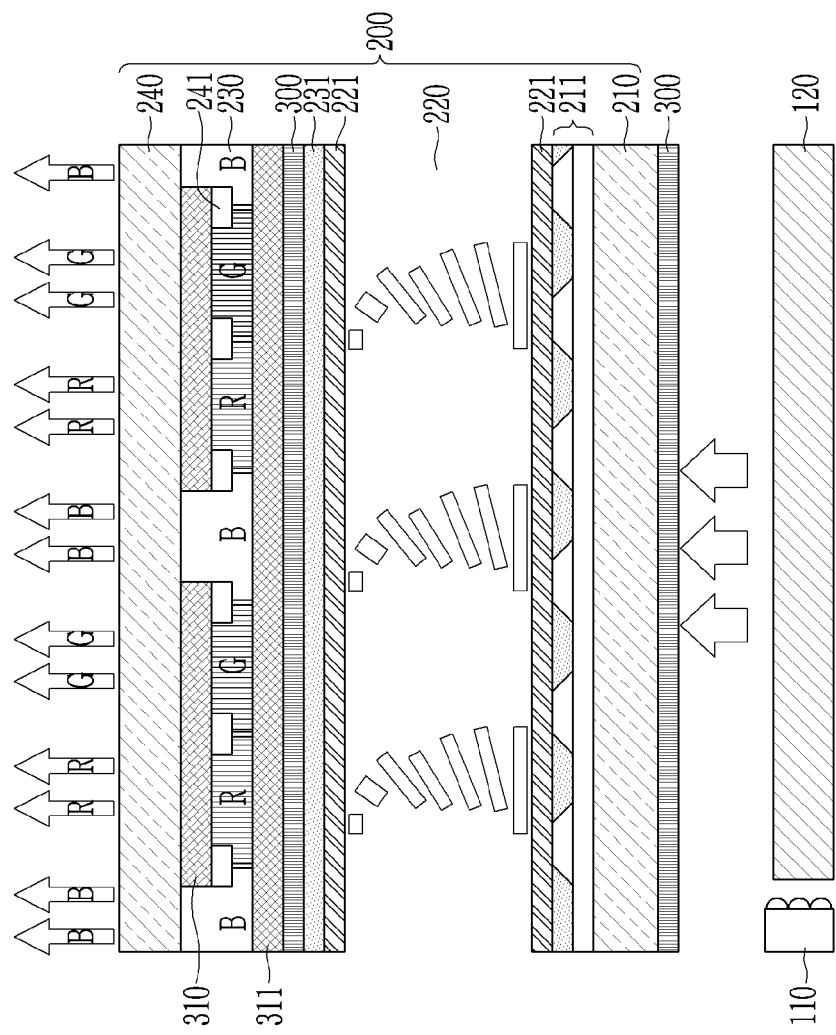
FIG. 8 shows a method of manufacturing a quantum dot-polymer composite pattern using a composition according to an embodiment.

Non-limiting examples of the display device (e.g., a liquid crystal display device) according to an embodiment are illustrated with a reference to a drawing. FIG. 8 is a schematic cross sectional view showing a liquid crystal display according to an embodiment. Referring to FIG. 8, the display device of an embodiment includes a liquid crystal panel 200, a polarizer 300 disposed under the liquid crystal panel 200, and a backlight unit (BLU) disposed under the polarizer 300.

The liquid crystal panel 200 includes a lower substrate 210, a stack structure, and a liquid crystal layer 220 disposed between the stack structure and the lower substrate. The stack structure includes a transparent substrate 240 and a photoluminescent layer 230 including a pattern of a quantum dot polymer composite.

The lower substrate 210 referred to be an array substrate may be a transparent insulating material substrate. The substrate is the same as described above. A wire plate 211 is provided on an upper surface of the lower substrate 210. The wire plate 211 may include a plurality of gate wires and data wires that define a pixel area, a thin film transistor disposed adjacent to a crossing region of gate wires and data wires, and a pixel electrode for each pixel area, but is not limited thereto. Details of such a wire plate are not particularly limited.

The liquid crystal layer 220 may be disposed on the wire plate 211. The liquid crystal layer 220 may include an alignment layer 221 on and under the layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are not particularly limited.

A lower polarizer 300 is provided under the lower substrate. Materials and structures of the polarizer 300 are not particularly limited. A backlight unit (e.g., emitting blue light) may be disposed under the polarizer 300.

An upper optical element or an upper polarizer 300 may be provided between the liquid crystal layer 220 and the transparent substrate 240, but is not limited thereto. For example, the upper polarizer may be disposed between the liquid crystal layer 220 and the light emission layer 230. The polarizer may be any suitable polarizer that used in a liquid crystal display device. The polarizer may be TAC (triacetyl cellulose) having a thickness of less than or equal to about 200 μm, but is not limited thereto. In an embodiment, the upper optical element may be a coating that controls a refractive index without a polarization function.

The backlight unit includes a light source 110. The light source may emit blue light or white light. The light source may include a blue LED, a white LED, a white OLED, or a combination thereof, but is not limited thereto.

The backlight unit may further include a light guide panel 120. In an embodiment, the backlight unit may be an edge-type lighting. For example, the backlight unit may include a reflector, a light guide panel provided on the reflector and providing a planar light source with the liquid crystal panel 200, at least one optical sheet on the light guide panel, for example, a diffusion plate, a prism sheet, and the like, or a combination thereof, but is not limited thereto. The backlight unit may not include a light guide panel. In an embodiment, the backlight unit may be a direct lighting. For example, the backlight unit may have a reflector, and may have a plurality of fluorescent lamps disposed on the reflector at regular intervals, or may have an LED operating substrate on which a plurality of light emitting diodes may be disposed, a diffusion plate thereon, and optionally at least one optical sheet. Details (e.g., each component of a light emitting diode, a fluorescent lamp, light guide panel, various optical sheets, and a reflector) of such a backlight unit are not particularly limited.

A black matrix 241 is provided under the transparent substrate 240 and has openings and hides a gate line, a data line, and a thin film transistor of the wire plate on the lower substrate. For example, the black matrix 241 may have a lattice shape. The photoluminescent layer 230 is provided in the openings of the black matrix 241 and has a quantum dot-polymer composite pattern including a first section (R) configured to emit a first light (e.g., red light), a second section (G) configured to emit a second light (e.g., green light), and a third section (B) configured to emit/transmit, for example blue light. The photoluminescent layer may further include at least one fourth section. The fourth section may include a quantum dot that emits different color from light emitted from the first to third sections (e.g., cyan, magenta, and yellow light).

In the light emission layer 230, sections forming a pattern may be repeated corresponding to pixel areas formed on the lower substrate. A transparent common electrode 231 may be provided on the photoluminescent color filter layer.

The third section (B) configured to emit/transmit blue light may be a transparent color filter that may not change a light emitting spectrum of the light source. In this case, blue light emitted from the backlight unit may enter in a polarized state and may be emitted through the polarizer and the liquid crystal layer as is. The third section may include a quantum dot emitting blue light.

If desired, the display device may further include a light blocking layer (blue cut filter) or a first optical filter layer. The blue light blocking layer may be disposed between bottom surfaces of the first section (R) and the second section (G) and the upper substrate 240 or on a top surface of the upper substrate 240. The blue light blocking layer may include a sheet having openings that correspond to a pixel area showing, e.g., emitting, a blue color (e.g., third section) and may be formed on portions corresponding to the first and second sections. As shown in FIG. 8, the first optical filter layer may be integrally formed as one body structure at the portions except portions overlapped with the third section, but is not limited thereto. At least two first optical filter layers may be spaced apart and be disposed on each of the positions overlapped with the first and the second sections.

For example, the first optical filter layer may block light having a part of a wavelength region in the visible light region and transmit light having other wavelength regions. For example, the first optical filter layer may block blue light and transmit light except blue light. For example, the first optical filter layer may transmit green light, red light, and/or or yellow light that is a mixed light thereof.

For example, the first optical filter layer may substantially block blue light having a wavelength of less than or equal to about 500 nm and may transmit light in another visible light wavelength region of greater than about 500 nm and less than or equal to about 700 nm.

For example, the first optical filter layer may have light transmittance of greater than or equal to about 70%, greater than or equal to about 80%, greater than or equal to about 90%, or even about 100% with respect to the other visible light of greater than about 500 nm and less than or equal to about 700 nm.

The first optical filter layer may include a polymer thin film including a dye, a pigment, or a combination thereof that absorbs light having a wavelength to be blocked. The first optical filter layer may block at least 80%, at least 90%, or at least 95% of blue light having a wavelength of less than or equal to about 480 nm and the first optical filter layer may have light transmittance of greater than or equal to about 70%, greater than or equal to about 80%, greater than or equal to about 90%, or even about 100% with respect to other visible light of greater than about 500 nm and less than or equal to about 700 nm.

The first optical filter layer may block (e.g., absorb) and substantially block blue light having a wavelength of less than or equal to about 500 nm and for example may selectively transmit green light or red light. In this case, at least two first optical filter layers may be spaced apart and disposed on each of the portions overlapped with the first and second sections, respectively. For example, a first optical filter layer selectively transmitting red light may be disposed on the portion overlapped with the section emitting red light and the first optical filter layer selectively transmitting green light may be disposed on the portion overlapped with the section emitting green light, respectively. For example, the first optical filter layer may include a first region, a second region, or a combination thereof wherein the first region blocks (e.g., absorb) blue light and red light and transmits light having a wavelength of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm) and the second region blocks (e.g., absorb) blue light and green light and transmits light having a wavelength of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm). The first region may be disposed at a place overlapped with the section emitting green light and the second region may be disposed at a place overlapped with the section emitting red light. The first region and the second region may be optically isolated. The first optical filter (layer) may contribute to improving color purity of a display device.

The first optical filter layer may be a reflective filter including a plurality of layers (e.g., inorganic material layers) with different refractive index. For example two layers having different refractive index may be alternately stacked with each other, or for example a layer having a relatively high refractive index and a layer having a relatively low refractive index may be alternately stacked with each other.

As the difference in refractive index between the layer having a relatively high refractive index and the layer having a relatively low refractive index increases, the wavelength selectivity of the first optical filter layer may also be increased. A thickness and the number of stacks in the layer having a relatively high refractive index and the layer having a relatively low refractive index may be determined according to a refractive index of each layer and a reflected wavelength, for example, each layer having a relatively high refractive index may have a thickness of about 3 nm to about 300 nm, and each layer having a relatively low refractive index may have a thickness of about 3 nm to about 300 nm.

A total thickness of the first optical filter layer may be, for example, from about 3 nm to about 10,000 nm, about 300 nm to about 10,000 nm, or about 1,000 nm to about 10,000 nm. All layers having a relatively high refractive index may have the same thickness and the same material or different material from each other, and all layers having a relatively low refractive index may have the same thickness and the same material or different material from each other.

The display device may further include a second optical filter layer 311 (e.g., red/green or yellow light recycling layer) disposed between the light emission layer and the liquid crystal layer (e.g., between light emission layer and upper polarizer) and transmitting at least a part of the third light and reflecting at least a part of the first light and the second light. The second optical filter layer may reflect light in a wavelength region of greater than about 500 nm. The first light may be a red light, the second light may be a green light, and the third light may be a blue light.

In the display device according to an embodiment, the second optical filter layer may be formed as an integrated one layer having a relatively planar surface.

In an embodiment, the second optical filter layer may include a monolayer having a relatively low refractive index, for example, the second optical filter layer may be a transparent thin film having a refractive index of less than or equal to about 1.4, less than or equal to about 1.3, or less than or equal to about 1.2.

The second optical filter layer having a relatively low refractive index may be, for example, a porous silicon oxide, a porous organic material, a porous organic/inorganic composite, or a combination thereof.

In an embodiment, the second optical filter layer may include a plurality of layers having different refractive indexes, for example, the second optical filter layer may be formed by alternately stacking two layers having different refractive indexes, or for example, the second optical filter layer may be formed by alternately stacking material having a relatively high refractive index and material having a relatively low refractive index.

The layer having a relatively high refractive index in the second optical filter layer may include, for example, hafnium oxide, tantalum oxide, titanium oxide, zirconium oxide, magnesium oxide, cesium oxide, lanthanum oxide, indium oxide, niobium oxide, aluminum oxide, silicon nitride, or a combination thereof, but according to an embodiment, layer having a relatively high refractive index in the second optical filter layer may include a variety of materials having a higher refractive index than the layer having a relatively low refractive index.

The layer having a relatively low refractive index in the second optical filter layer may include, for example, a silicon oxide, but according to an embodiment, layer having a relatively low refractive index in the second optical filter layer may include a variety of materials having a lower refractive index than the layer having a relatively high refractive index.

As the difference in refractive index between the layer having a relatively high refractive index and the layer having a relatively low refractive index increases, the wavelength selectivity of the second optical filter layer may also be increased.

In the second optical filter layer, the thickness of each of the layer having a relatively high refractive index and the layer having a relatively low refractive index and the number of stacks in each of the layers may be determined depending upon a refractive index of each layer and the reflected wavelength, for example, each layer having a relatively high refractive index in the second optical filter layer may have a thickness of about 3 nm to about 300 nm, and each layer having a relatively low refractive index in the second optical filter layer may have a thickness of about 3 nm to about 300 nm. A total thickness of the second optical filter layer may be, for example, from about 3 nm to about 10,000 nm, about 300 nm to about 10,000 nm, or about 1,000 nm to about 10,000 nm. Each of the layer having a relatively high refractive index and the layer having a relatively low refractive index in the second optical filter layer may have the same thickness and materials or different thickness and materials from each other.

The second optical filter layer may reflect at least one part of the first light (R) and the second light (G) and transmits at least one part (e.g., whole part) of the third light (B). For example, the second optical filter layer may transmit only the third light (B) in a blue light wavelength region of less than or equal to about 500 nm and light in a wavelength region of greater than about 500 nm, that is, green light (G), yellow light, red light (R), and the like may not be passed through the second optical filter layer and reflected. Thus the reflected green light and red light may pass through the first and the second sections to be emitted to the outside of the display device 10.

The second optical filter layer may reflect a wavelength region of greater than about 500 nm in greater than or equal to about 70%, greater than or equal to about 80%, or greater than or equal to about 90%, or even about 100%.

The second optical filter layer may have a transmittance to, e.g., of, a wavelength region of less than or equal to about 500 nm of, for example, greater than or equal to about 90%, greater than or equal to about 92%, greater than or equal to about 94%, greater than or equal to about 96%, greater than or equal to about 98%, greater than or equal to about 99%, or even about 100%.

In an embodiment, the stack structure may be produced by a method using the photoresist composition. The method may include forming a film of the composition on a substrate;

exposing a selected region of the film to light (e.g., a wavelength of less than or equal to about 400 nm); and developing the exposed film with an alkali developing solution to obtain a pattern of the quantum dot polymer composite.

The substrate and the composition have the same specification as described above. Non-limiting methods of forming the pattern are illustrated, referring to FIG. 9.

The composition is coated to have a predetermined thickness on a substrate in an appropriate method of spin coating, slit coating, and the like. The formed film may be, optionally, pre-baked (PRB). The pre-baking may be performed by selecting an appropriate condition from conditions of a temperature, time, an atmosphere, and the like.

The formed (or optionally pre-baked) film is exposed to light having a predetermined wavelength under a mask having a predetermined pattern. A wavelength and intensity of the light may be selected considering types and amounts of the photoinitiator, types and amounts of the quantum dots, and the like.

The exposed film is treated with an alkali developing solution (e.g., dipping or spraying) to dissolve an unexposed region and obtain a desired pattern. The obtained pattern may be, optionally, post-baked (FOB) to improve crack resistance and solvent resistance of the pattern, for example, at about 150° C. to about 230° C. for a predetermined time (e.g., greater than or equal to about 10 minutes or greater than or equal to about 20 minutes).

When the quantum dot-polymer composite pattern has a plurality of repeating sections, a quantum dot-polymer composite having a desired pattern may be obtained by preparing a plurality of compositions including a quantum dot having desired photoluminescence properties (a photoluminescence peak wavelength and the like) to form each repeating section (e.g., a red light emitting quantum dot, a green quantum dot, or optionally, a blue quantum dot) a number of times (e.g., twice or more or three times or more) repeating a formation of the above pattern about each composition. For example, the quantum dot-polymer composite may have a pattern of at least two repeating color sections (e.g., RGB sections). The quantum dot-polymer composite pattern may be used as a photoluminescence-type color filter in a display device.

In an embodiment, the stack structure may be produced using an ink composition. The method may include depositing the ink composition (e.g., to provide a desirable pattern) on the desirable substrate using an appropriate system (e.g., droplet discharging device such as inkjet or nozzle printing device) and heating the ink composition to remove a solvent and to perform a polymerization. The method may provide a highly precise quantum dot-polymer composite film or pattern in a relatively simple and rapid way.

An embodiment provides an electronic device including the quantum dot. The device may include a light emitting diode (LED), an organic light emitting diode (OLED), a sensor, a solar cell, an imaging sensor, or a liquid crystal display (LCD), but is not limited thereto.

Hereinafter, the embodiments are illustrated in more detail with reference to examples. However, they are exemplary embodiments of the present invention, and the present invention is not limited thereto.

EXAMPLES

Analysis Methods
1. Ultraviolet-visible (UV-Vis) Spectroscopy Analysis

An Agilent Cary 5000 spectrometer is used to perform an ultraviolet (UV) spectroscopy analysis and obtain an UV-Visible absorption spectrum.

2. Photoluminescence Analysis

A Hitachi F-7000 spectrometer is used to obtain a photoluminescence (PL) spectrum of a produced quantum dot at a wavelength of 450 nanometers (nm).

3. Blue Light Absorption and Quantum Efficiency (QE) of Composites

An integrating sphere and HAMAMATSU-Quantaurus-QY, C11347 (producer: Hamamatsu) are used to measure a blue light absorption and a quantum efficiency. The blue light absorption and the quantum efficiency are obtained according to the following formulae:

Blue light absorption (rate)=$(B-B')/B \times 100\%$

Quantum efficiency=$A/B$

B: Light dose of blue excitation light
A: Light dose of green (or red) light emitted from composite by irradiating blue excitation light
B': Light dose of blue excitation light emitted from composite

Example 1

A simulation based on a core-shell effective parameter is performed using an EMA (effective mass approximation) method.

Wave function and energy obtained using one band Schrodinger Equation in an effective mass approximation are substituted in the following equation, and quantum dot absorption spectrum modeling is carried out using a core-shell and a quantum well (QVV) structure core (reference: Jasprit Singh, Semiconductor Optoelectronics, pp. 183 (1995)):

$$W_{abs}(\hbar\omega) = \frac{2\pi}{\hbar} \frac{e^2}{m_0^2} \frac{\hbar n_{ph}}{2\omega\epsilon} \sum_{i,f} \left| \int \psi_f^*(\hat{a}\cdot\bar{p})e^{i\bar{k}_{ph}\cdot\bar{r}}\psi_i d^3r \right|^2 \delta(E_i - E_f + \hbar\omega)$$

$W_{abs}$: light absorption rate $\psi_{i/f}$: wave function (initial/final)

-continued $\hbar$: plank constant $\hat{a}$: polarizing direction of photon $\omega$: frequency of photon $\bar{p}$: momentum operator $e$: charge of electron $\bar{k}_{ph}$: wave vector of photon $m_0$: mass of electron $\bar{r}$: position vector $n_{ph}$: density of photon $\delta$: delta function $\epsilon$: permittivity $E_{i/f}$: energy level (initial/final)

Figure 10:
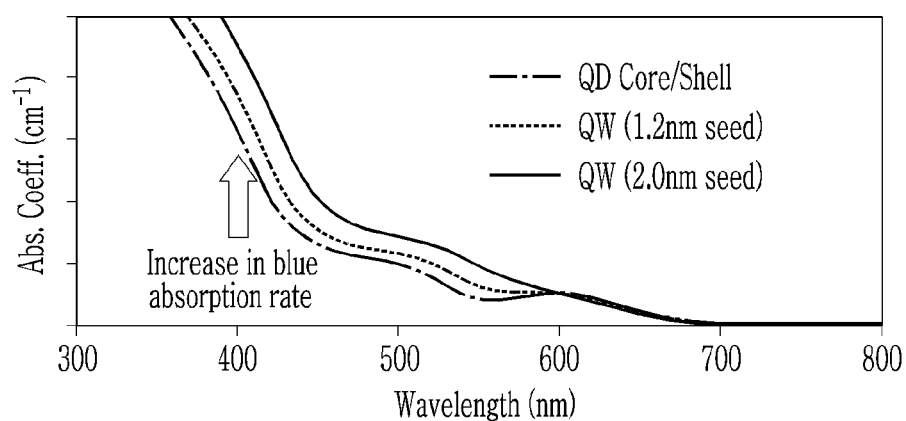
FIG. 10 is a graph of Absorption Coefficient (Abs. Coeff.) (inverse centimeters ($cm^{-1}$)) versus wavelength (nm) showing an ultraviolet-visible (UV-Vis) absorption obtained by simulation of quantum dots of a core/shell structure and quantum dots of a seed/quantum well/shell structure (having different diameters), that have the same compositions.

The results are shown in FIG. 10. From the results of FIG. 10, it is confirmed that particle including a quantum well may exhibit a significantly improved blue light absorption, compared to the core/shell quantum dot having a luminescence center of the same composition and size.

Example 2

Selenium and sulfur are dispersed in trioctylphosphine (TOP) to prepare 1 molar (M) Se/TOP stock solution and 1M S/TOP stock solution. Diethyl zinc is dissolved in hexane to obtained 1M Zn stock solution.

1. An organic ligand including oleic acid and a diethyl zinc stock solution are dissolved into trioctylamine in a 300 milliliter (mL) reaction flask and heated at 120° C. under vacuum. It is substituted with inert gas in the flask and injected with the Se/TOP stock solution and reacted for 40 minutes after increasing the temperature up to 300° C.

After the reaction, ethanol is added into the reaction solution which is promptly cooled down to the room temperature and centrifuged to recover a ZnSe seed. The recovered ZnSe seed is dispersed in toluene. A transmission electron microscopic analysis is performed for the ZnSe seed. From the results, it is confirmed that the obtained core particles mostly have a spherical shape.

2. Indium acetate and palmitic acid are dissolved into 1-octadecene in 300 mL reaction flask and heated at 120° C. under vacuum. A molar ratio of indium and palmitic acid is at 1:3. After 1 hour, the atmosphere in the reactor is replaced with nitrogen. The flask is heated to 280° C. while toluene dispersion of the obtained ZnSe seed is promptly added thereto, and a mixed solution of tris(trimethylsilyl)phosphine (TMS3P) and trioctylphosphine is promptly injected thereto and a reaction proceeds for a predetermined time to form an InP quantum well on the seed.

Then a Se/Top stock solution is added together with a Zn precursor and reacted to provide a ZnSe layer, subsequently, a Se/Top stock solution is added together with a Zn precursor and reacted to provide a ZnS layer.

After the reaction, ethanol is added into the reaction solution which is promptly cooled down to the room temperature and centrifuged to recover a ZnSe/InP/ZnSeS seed/quantum well/shell particle and is dispersed into an organic solvent (e.g., toluene or octane). The seed has a radius of 1.5 nm, the quantum well has a thickness of 0.4, the shell has a thickness of 1.7 nm, and a (average) size of the quantum dot is about 7.2 nm.

Figure 11:
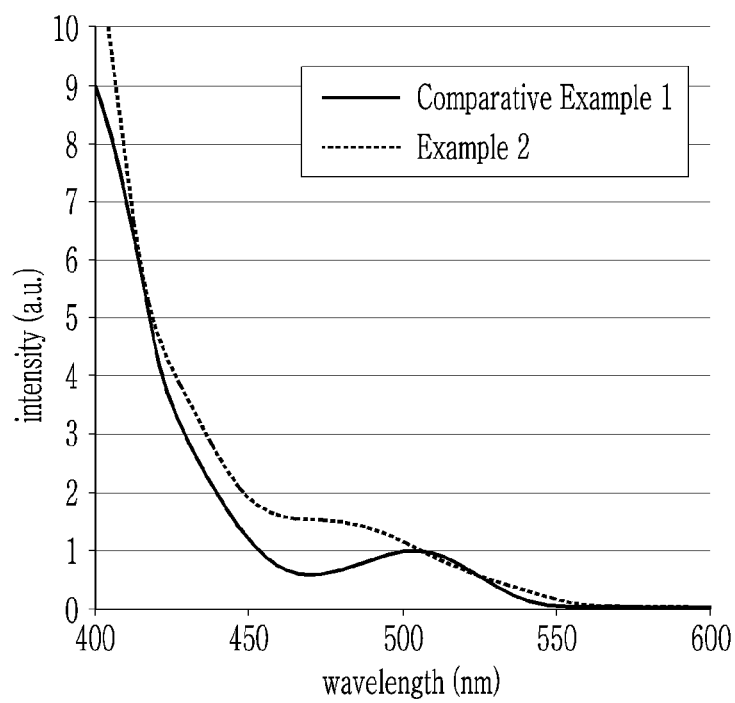
FIG. 11 is a graph of intensity (arbitrary units (a.u.) versus wavelength (nm) showing a UV-Vis spectroscopic analysis and a photoluminescence spectroscopic analysis conducted in Comparative Example 1 and Example 2.

3. A UV-vis spectroscopic analysis and a photoluminescence spectroscopic analysis are carried out with the obtained semiconductor nanocrystal particle, and the results are shown in FIG. 11 and Table 1.

Comparative Example 1

A InP/ZnSeS core/shell quantum dot (size: 6.1 nm) is obtained in accordance with the same procedure as in Example 1, except that the InP core obtained Reference Example 1 is used, and the InP quantum well is not formed. A UV-vis spectroscopic analysis and a photoluminescence spectroscopic analysis are carried out with the obtained quantum dot, and the results are shown in the following Table 1 and FIG. 11.

TABLE 1

| QD | PL (nm) |
|---|---|
| Comparative Example 1 | 526 |
| Example 2 | 525 |

From the results of UV-vis spectroscopy analysis, it is confirmed that quantum dots according to Example 2 have higher adsorption at 450 nm than quantum dots according to Comparative Example 1.

Experimental Example 1: Preparation of Quantum Dot Polymer Composite and Production of Pattern Therefrom (1) Preparation of Quantum Dot-Binder Dispersion Each quantum dot chloroform dispersion according to Example 2 or Comparative Example 1 is mixed with a binder (a quaternary copolymer of methacrylic acid, benzyl methacrylate, hydroxyethyl methacrylate, and styrene, an acid value: 130 milligrams of potassium hydroxide per gram (mg KOH/g), a molecular weight: 8,000, a methacrylic acid:benzyl methacrylate:hydroxyethyl methacrylate:styrene (a mole ratio)=61.5%:12%:16.3%:10.2%) solution (polypropylene glycol monomethyl ether acetate having a concentration of 30 weight percent (wt %)) to prepare quantum dot-binder dispersion.

(2) Preparation of Photosensitive Composition

The quantum dot binder dispersion is mixed with hexaacrylate having the following structure as a photopolymerizable monomer, glycoldi-3-mercaptopropionate (hereinafter, 2T), an oxime ester compound as an initiator, and $TiO_2$ and propylene glycol methyl ether acetate (PGMEA) as a light diffusing agent to prepare a composition.

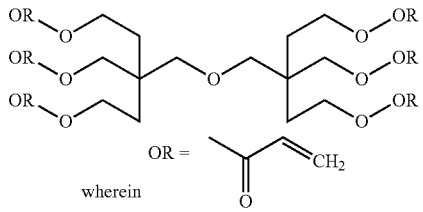

The composition includes 40 wt % of the quantum dot, 12.5 wt % of the binder polymer, 25 wt % of 2T, 12 wt % of the photopolymerizable monomer, 0.5 wt % of the initiator, and 10 wt % of the light diffusing agent based on a solid content of the composition, and a total solid content is 25%.

(3) Production of Quantum Dot-Polymer Composite Pattern and Heat Treatment

Each photosensitive composition is spin-coated on a glass substrate at 150 revolutions per minute (rpm) for 5 seconds to obtain films. The films are pre-baked (PRB) at 100° C. These pre-baked films are exposed to irradiation of light (a wavelength: 365 nm, intensity: 100 millijoules (mJ)) for 1 second under a mask having a predetermined pattern (e.g., a square dot or a stripe pattern), developed in a potassium hydroxide aqueous solution (a concentration: 0.043%) for 50 seconds to obtain quantum dot-polymer composite patterns (a thickness: about 6 um).

The obtained pattern is heat-treated (FOB) for 30 minutes under a nitrogen atmosphere.

Photoluminescence wavelength, blue light absorption, and quantum efficiency (QE) of the obtained films are measured and the results are shown in Table 2.

TABLE 2

|  |  | Comparative Example 1 | Example 2 |
|---|---|---|---|
| PRB | QE (%) | 23 | 23 |
|  | Blue light absorption (%) | 77 | 83 |
| POB | QE (%) | 22 | 22 |
|  | Blue light absorption (%) | 76 | 82 |
| Process maintenance (PRB QE/POB QE) |  | 96% | 96 |

Referring to the results of Table 2, the quantum dot of Example 1 exhibits remarkably improved blue light absorption while having high quantum efficiency and process maintenance compared with the quantum dot of Comparative Example 1.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. Quantum dots comprising:
   a seed comprising a first semiconductor nanocrystal,
   a quantum well comprising a second semiconductor nanocrystal, the quantum well surrounding the seed, and
   a shell disposed on the quantum well, the shell comprising a third semiconductor nanocrystal,
   wherein the second semiconductor nanocrystal has a different composition from each of the first semiconductor nanocrystal and the third semiconductor nanocrystal,
   wherein an energy bandgap of the second semiconductor nanocrystal is smaller than an energy bandgap of the first semiconductor nanocrystal and an energy bandgap of the third semiconductor nanocrystal,
   wherein the quantum dots do not comprise cadmium,
   wherein the quantum dots are configured to emit green light, and
   wherein an average size of the quantum dots is greater than or equal to about 5 nm.

2. The quantum dots of claim 1, wherein a thickness of the quantum well is greater than or equal to about 0.3 nanometers.

3. The quantum dots of claim 1, wherein the seed has a radius of greater than or equal to about 0.5 nanometers.

4. The quantum dots of claim 1, wherein the shell has a thickness of greater than or equal to about 0.5 nanometers and less than or equal to about 4 nanometers.

5. The quantum dots of claim 1,
wherein the first semiconductor nanocrystal comprises zinc; and selenium, sulfur, or a combination thereof, and
wherein the third semiconductor nanocrystal comprises zinc; and selenium, sulfur, or a combination thereof.

6. The quantum dots of claim 1, wherein
the first semiconductor nanocrystal comprises ZnSe, ZnSeS, ZnS, or a combination thereof, and
the third semiconductor nanocrystal comprises ZnSe, ZnSeS, ZnS, or a combination thereof.

7. The quantum dots of claim 1, wherein
the shell comprises two or more layers comprising a first layer and a second layer adjacent to the first layer and
the first layer comprise a composition of a semiconductor nanocrystal that is different from a composition of a semiconductor nanocrystal of the second layer.

8. The quantum dots of claim 1, wherein the second semiconductor nanocrystal comprises a Group II-VI compound, a Group III-V compound, or a combination thereof.

9. The quantum dots of claim 1, wherein the second semiconductor nanocrystal comprises ZnSe, ZnTeSe, InP, InZnP, InAs, GaAs, or a combination thereof.

10. The quantum dots of claim 1, wherein a radius of the seed is greater than or equal to about 60% of a thickness of the shell.

11. The quantum dots of claim 1, wherein a thickness of the shell is greater than or equal to about 1.3 nanometers.

12. The quantum dots of claim 1, wherein a radius of the seed is greater than or equal to about 0.9 nanometers.

13. The quantum dots of claim 1, wherein a radius of the seed is less than or equal to about 1.6 nanometers.

14. The quantum dots of claim 1, wherein an average size of the quantum dots is greater than or equal to about 5.5 nm.

15. A patterned film comprising
a repeating section comprising a first section, the first section being configured to emit green light,
wherein the first section comprises a quantum dot polymer composite,
the quantum dot-polymer composite comprises
a polymer matrix comprising
a dispersing agent,
a polymerization product of a photopolymerizable monomer comprising a carbon-carbon double bond, and
optionally a polymerization product of the photopolymerizable monomer and a thiol compound; and
first quantum dots dispersed in the polymer matrix and configured to emit green light,
the first quantum dots comprise the quantum dots of claim 1.

16. The patterned film of claim 15, wherein
a maximum peak wavelength of the green light is within the range of about 500 nanometers to about 580 nanometers and a thickness of the quantum well is greater than or equal to about 0.4 nanometers and less than or equal to about 1.9 nanometers.

17. The patterned film of claim 15, wherein
the seed has a radius of greater than or equal to about 0.5 nanometers and a thickness of the shell is greater than or equal to about 0.5 nanometers.

18. The patterned film of claim 15, wherein
the first semiconductor nanocrystal comprises zinc; and selenium, sulfur, or a combination thereof,
the third semiconductor nanocrystal comprises zinc and sulfur, and
the second semiconductor nanocrystal comprises ZnSe, ZnTeSe, InP, InZnP, InAs, GaAs, or a combination thereof.

19. The patterned film of claim 15, wherein
the repeating section comprises a second section to emit a second light having a different maximum peak wavelength from the green light and
the second section comprises a second quantum dot configured to emit the second light.

20. A display device, comprising
a light source and
a photoluminescence element,
wherein the photoluminescence element comprises
a substrate and
the patterned film of claim 15 disposed on a surface of the substrate, and
the light source is configured to supply the photoluminescence element with incident light.

21. The quantum dots of claim 1, wherein an average size of the quantum dots is less than or equal to about 50 nm.

22. The quantum dots of claim 1, wherein an average size of the quantum dots is less than or equal to about 20 nm.

23. The quantum dots of claim 1, wherein an average size of the quantum dots is less than or equal to about 12 nm.

24. The quantum dots of claim 1, wherein an average size of the quantum dots is from about 5 nm to about 7 nm.

25. The quantum dots of claim 14, wherein an average size of the quantum dots is less than or equal to about 8 nm.

26. The quantum dots of claim 14, wherein an average size of the quantum dots is less than or equal to about 7 nm.

27. A quantum dot comprising:
a seed comprising a first semiconductor nanocrystal,
a quantum well comprising a second semiconductor nanocrystal, the quantum well surrounding the seed, and
a shell disposed on the quantum well, the shell comprising a third semiconductor nanocrystal,
wherein the second semiconductor nanocrystal has a different composition from each of the first semiconductor nanocrystal and the third semiconductor nanocrystal,
wherein an energy bandgap of the second semiconductor nanocrystal is smaller than an energy bandgap of the first semiconductor nanocrystal and an energy bandgap of the third semiconductor nanocrystal,
wherein the quantum dot does not comprise cadmium,
wherein the quantum dot is configured to emit green light having a wavelength of from about 500 nm to about 560 nm, and
wherein a size of the quantum dot is from about 4 nm to about 7 nm.

28. The quantum dot of claim 27, wherein the wavelength of the green light is from about 510 nm to about 540 nm.

29. The quantum dot of claim 27, wherein the quantum dot shows a full width at half maximum of less than or equal to about 40 nm.

* * * * *